(12) United States Patent
Schweitzer, III et al.

(10) Patent No.: US 8,319,628 B2
(45) Date of Patent: Nov. 27, 2012

(54) THREE-PHASE FAULTED CIRCUIT INDICATOR

(75) Inventors: Edmund O. Schweitzer, III, Pullman, WA (US); Laurence V. Feight, Island Lake, IL (US); James Manely Duros, Chicago, IL (US); Joseph Robert Rauch, Cary, IL (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 871 days.

(21) Appl. No.: 12/417,893

(22) Filed: Apr. 3, 2009

(65) Prior Publication Data
US 2009/0251308 A1    Oct. 8, 2009

Related U.S. Application Data

(60) Provisional application No. 61/042,636, filed on Apr. 4, 2008.

(51) Int. Cl.
*G08B 1/08* (2006.01)

(52) U.S. Cl. ............ 340/539.1; 340/650; 324/509; 324/133; 361/42

(58) Field of Classification Search ............ 361/42; 340/650, 539.1; 324/509, 133
See application file for complete search history.

(56) References Cited

U.S. PATENT DOCUMENTS

| | | | |
|---|---|---|---|
| 3,426,276 A | 2/1969 | Schweitzer | |
| 3,676,740 A | 7/1972 | Schweitzer | |
| 3,702,966 A | 11/1972 | Schweitzer | |
| 3,708,724 A | 1/1973 | Schweitzer | |
| 3,715,742 A | 2/1973 | Schweitzer | |
| 3,781,682 A | 12/1973 | Schweitzer | |
| 3,816,816 A | 6/1974 | Schweitzer | |
| 3,876,911 A * | 4/1975 | Schweitzer, Jr. | 361/102 |
| 3,906,477 A | 9/1975 | Schweitzer | |
| 3,974,446 A | 8/1976 | Schweitzer | |
| 3,991,366 A | 11/1976 | Schweitzer | |
| 4,063,171 A | 12/1977 | Schweitzer | |
| 4,086,529 A | 4/1978 | Schweitzer | |
| 4,096,539 A * | 6/1978 | Scaturro | 361/93.6 |

(Continued)

FOREIGN PATENT DOCUMENTS

WO        9521389        8/1995

(Continued)

OTHER PUBLICATIONS

Valdes, IEEE Ground Fault DER-035 Paper No. PPIC-2005-26, presented at PPIC Jacksonville, FL, 2005, Ground Fault Detection in Multiple Source Solidly Grounded Systems via the Single-Processor Concept for Circuit Protection.

(Continued)

*Primary Examiner* — Eric M Blount
(74) *Attorney, Agent, or Firm* — Eugene M. Cummings, PC

(57) ABSTRACT

A three-phase faulted circuit indicator adjustable to accommodate a variety of three-phase power cables is disclosed. In one embodiment, faulted circuit indicator comprises a flexible holder that encircles the monitored conductor slightly more than one time. The flexible holder includes a plurality of magnetic sensors for monitoring the current within the internal conductors of the power cable, a logic circuit for determining the occurrence of a fault, and an output device for providing an indication of a fault. In a second embodiment, the faulted circuit indicator comprises a plurality of sensor compartments, each disposed about a central point, and each coupled to two other sensor compartments.

27 Claims, 23 Drawing Sheets

U.S. PATENT DOCUMENTS

| | | | |
|---|---|---|---|
| 4,164,701 | A | 8/1979 | Gulledge |
| 4,234,847 | A | 11/1980 | Schweitzer |
| 4,251,770 | A | 2/1981 | Schweitzer |
| 4,263,550 | A | 4/1981 | Schweitzer |
| 4,288,743 | A | 9/1981 | Schweitzer |
| 4,375,617 | A | 3/1983 | Schweitzer |
| 4,414,543 | A | 11/1983 | Schweitzer |
| 4,424,512 | A | 1/1984 | Schweitzer |
| 4,438,403 | A | 3/1984 | Schweitzer |
| 4,456,873 | A | 6/1984 | Schweitzer |
| 4,458,198 | A | 7/1984 | Schweitzer |
| 4,641,220 | A | 2/1987 | Schweitzer |
| 4,686,518 | A | 8/1987 | Schweitzer |
| 4,794,329 | A | 12/1988 | Schweitzer |
| 4,794,331 | A | 12/1988 | Schweitzer |
| 4,794,332 | A | 12/1988 | Schweitzer |
| 4,795,982 | A | 1/1989 | Schweitzer |
| 4,904,932 | A | 2/1990 | Schweitzer |
| 5,008,651 | A | 4/1991 | Schweitzer |
| 5,070,301 | A | 12/1991 | Schweitzer |
| 5,153,565 | A | 10/1992 | Schweitzer |
| 5,175,695 | A | 12/1992 | Czajkowski |
| 5,218,307 | A | 6/1993 | Hiller |
| 5,220,311 | A | 6/1993 | Schweitzer |
| 5,274,324 | A | 12/1993 | Schweitzer |
| 5,282,388 | A | 2/1994 | Czajkowski |
| 5,357,810 | A | 10/1994 | Czajkowski |
| 5,406,195 | A | 4/1995 | Schweitzer |
| 5,420,502 | A | 5/1995 | Schweitzer |
| 5,565,783 | A | 10/1996 | Lau |
| 5,652,506 | A | 7/1997 | Sorenson et al. |
| 5,677,623 | A | 10/1997 | Schweitzer |
| 5,677,678 | A | 10/1997 | Schweitzer |
| 5,821,869 | A | 10/1998 | Schweitzer |
| 5,889,399 | A | 3/1999 | Schweitzer |
| 6,429,661 | B1 | 8/2002 | Schweitzer, Jr. |
| 6,717,397 | B2 | 4/2004 | Sorenson, Jr. |
| 6,727,682 | B1 | 4/2004 | Tobin |
| 6,737,869 | B2 | 5/2004 | Mody |
| 6,825,650 | B1 | 11/2004 | McCormack |
| 7,227,348 | B2 | 6/2007 | Sorensen |
| 7,282,921 | B2 | 10/2007 | Sela |
| 8,130,480 | B2 * | 3/2012 | DiSalvo ............... 361/42 |
| 2007/0086130 | A1 | 4/2007 | Sorensen |

FOREIGN PATENT DOCUMENTS

| | | |
|---|---|---|
| WO | 2006123320 | 11/2006 |
| WO | 2007073686 | 7/2007 |

OTHER PUBLICATIONS

PCT, International Search Report for PCT/US2009/039403, Jun. 12, 2009.

PCT, Written Opinion of the International Searching Authority for PCT/US2009/039403, Jun. 12, 2009.

* cited by examiner

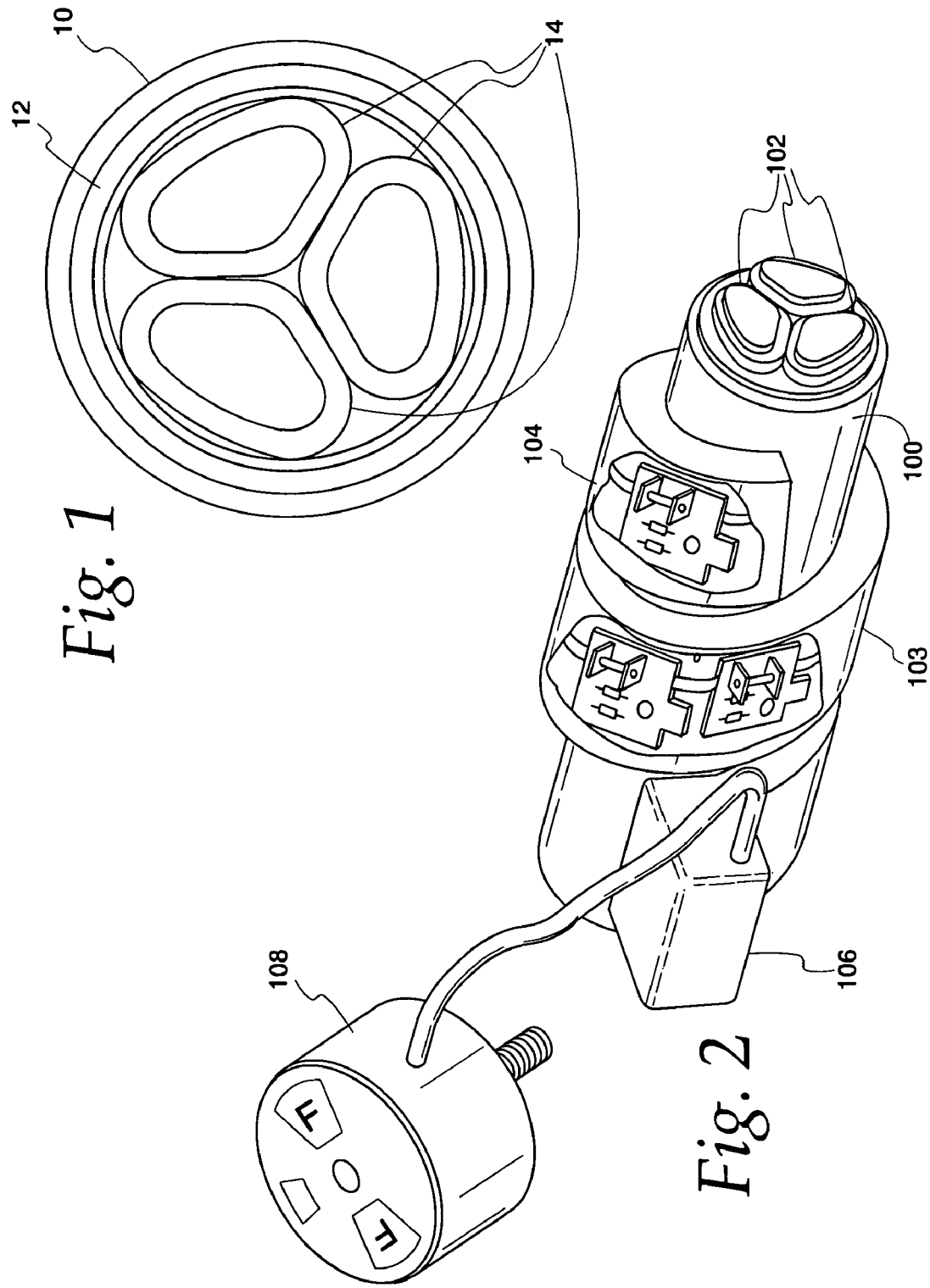

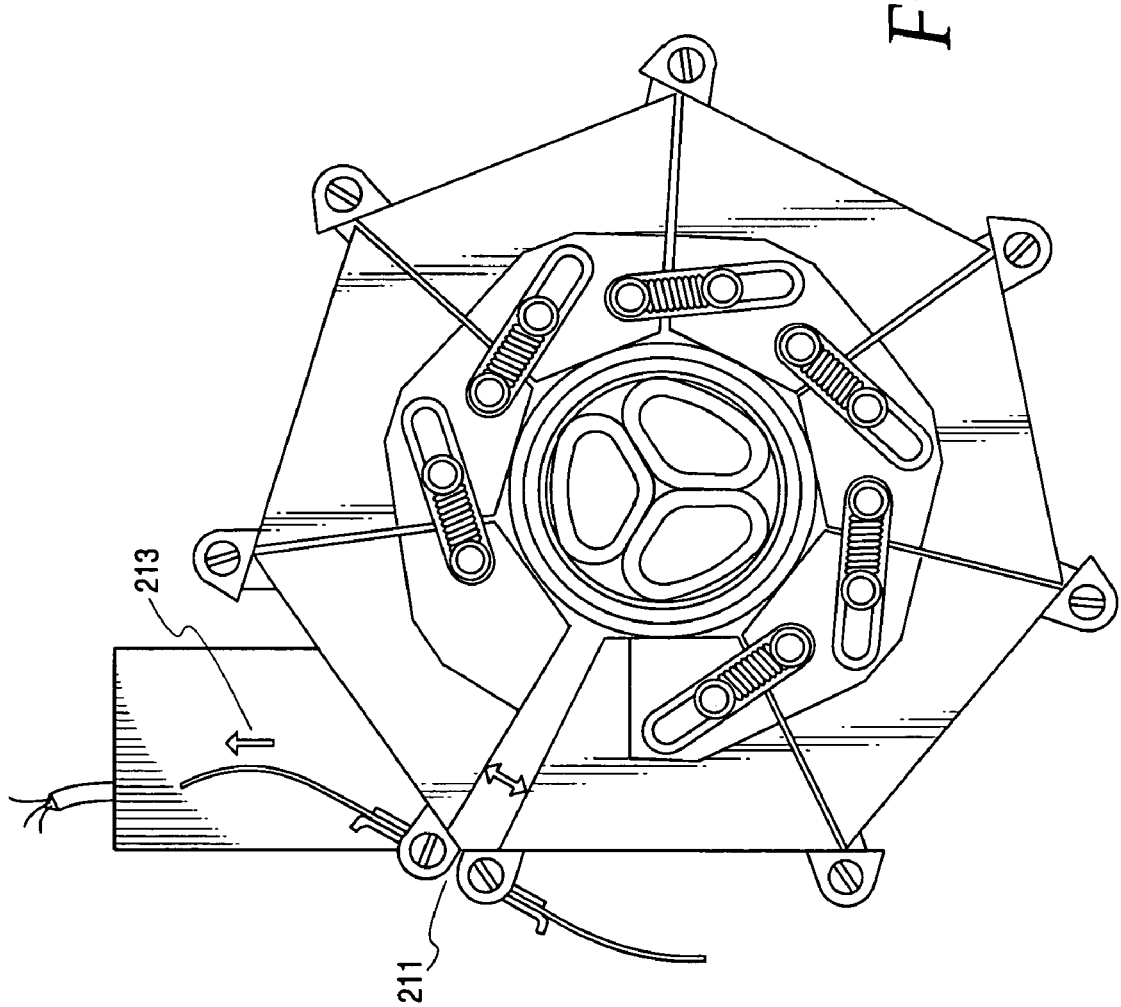

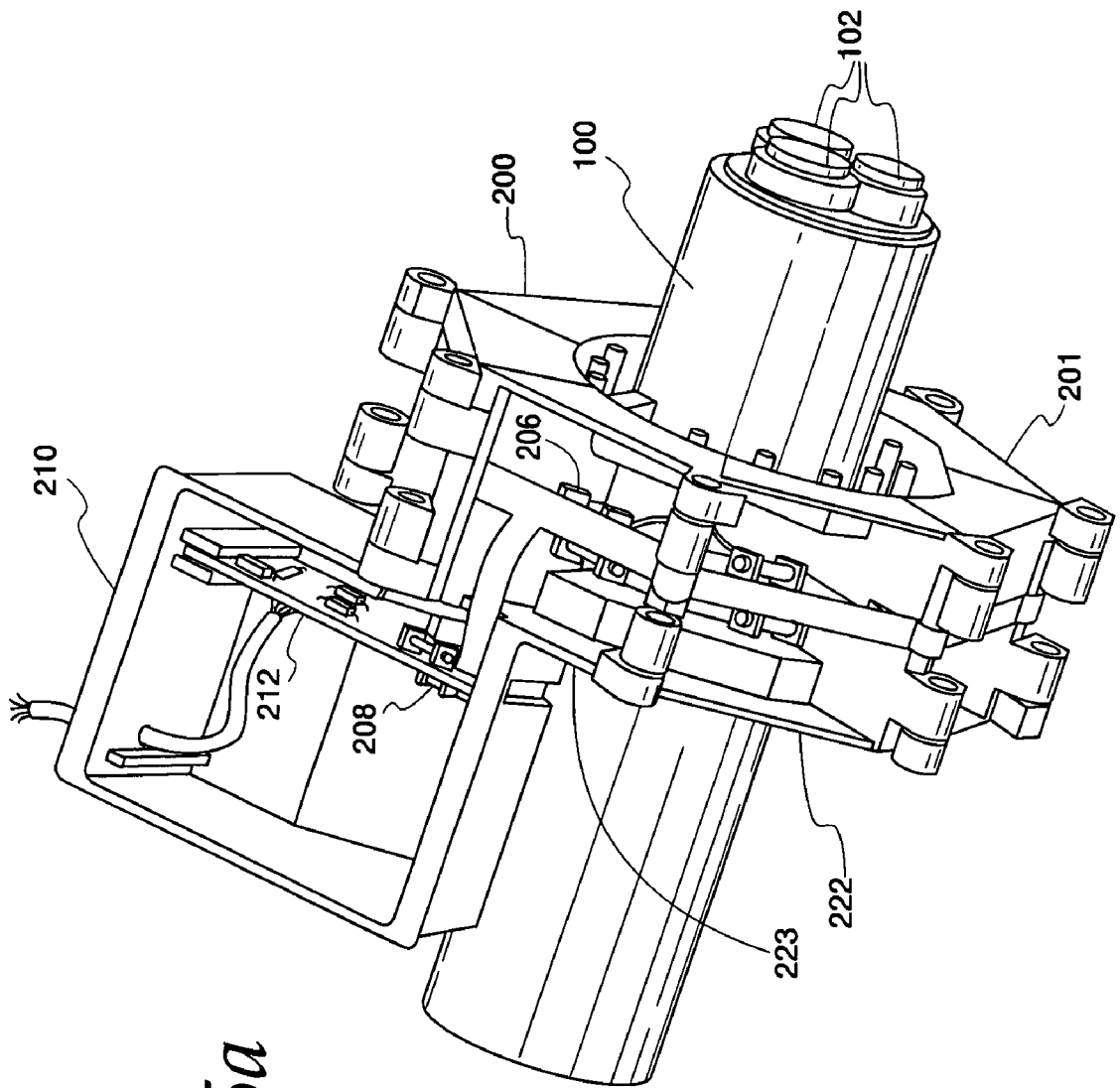

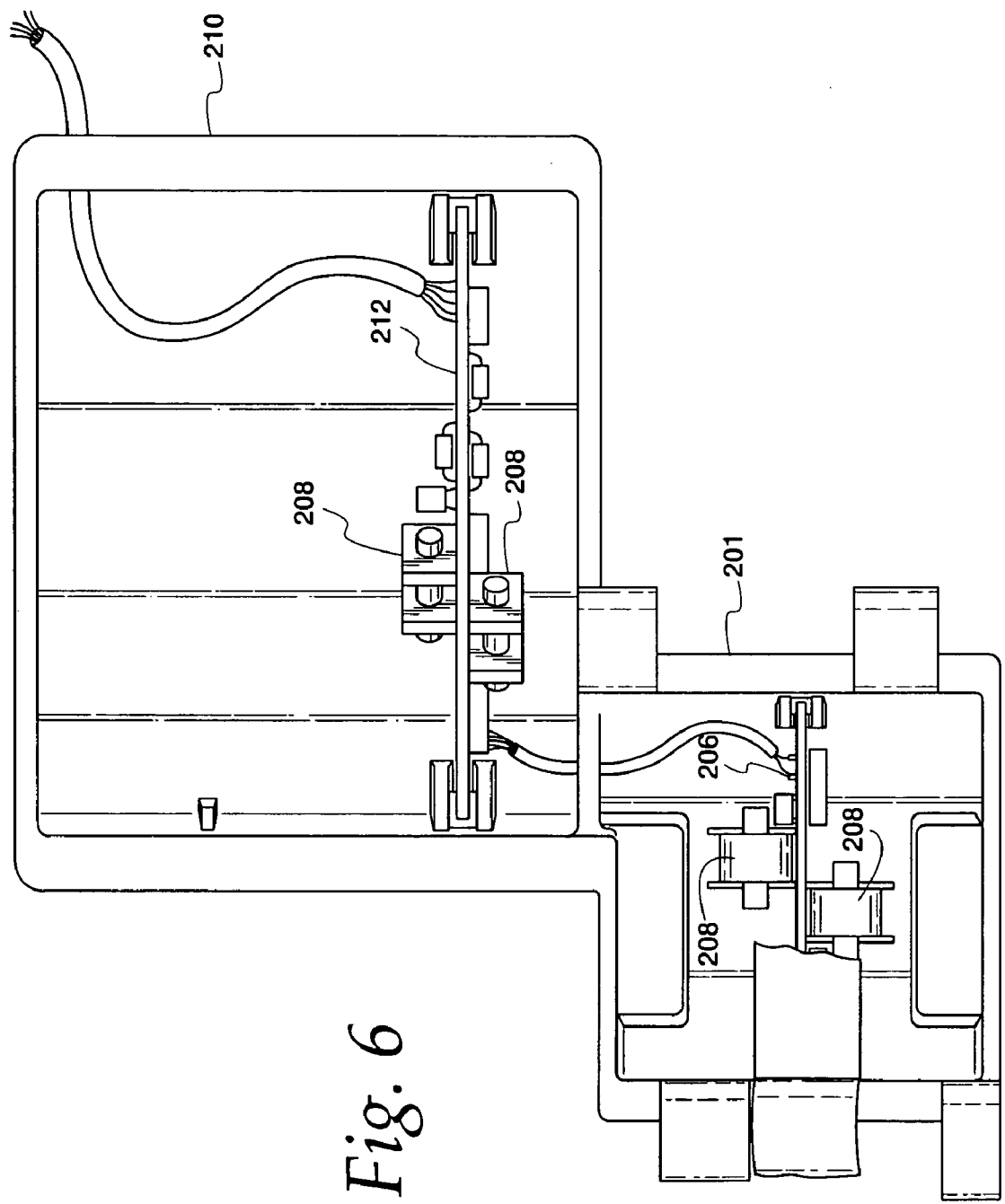

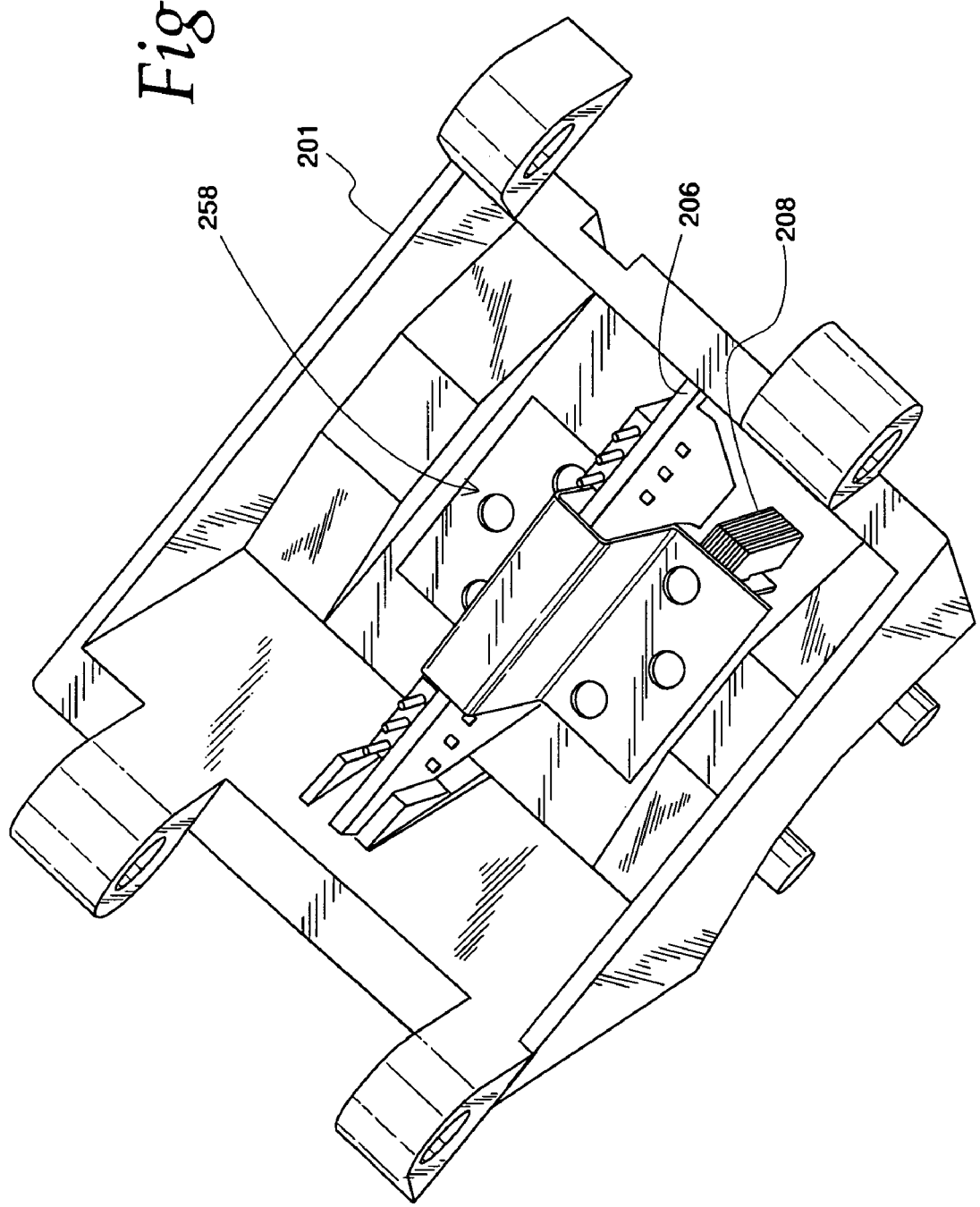

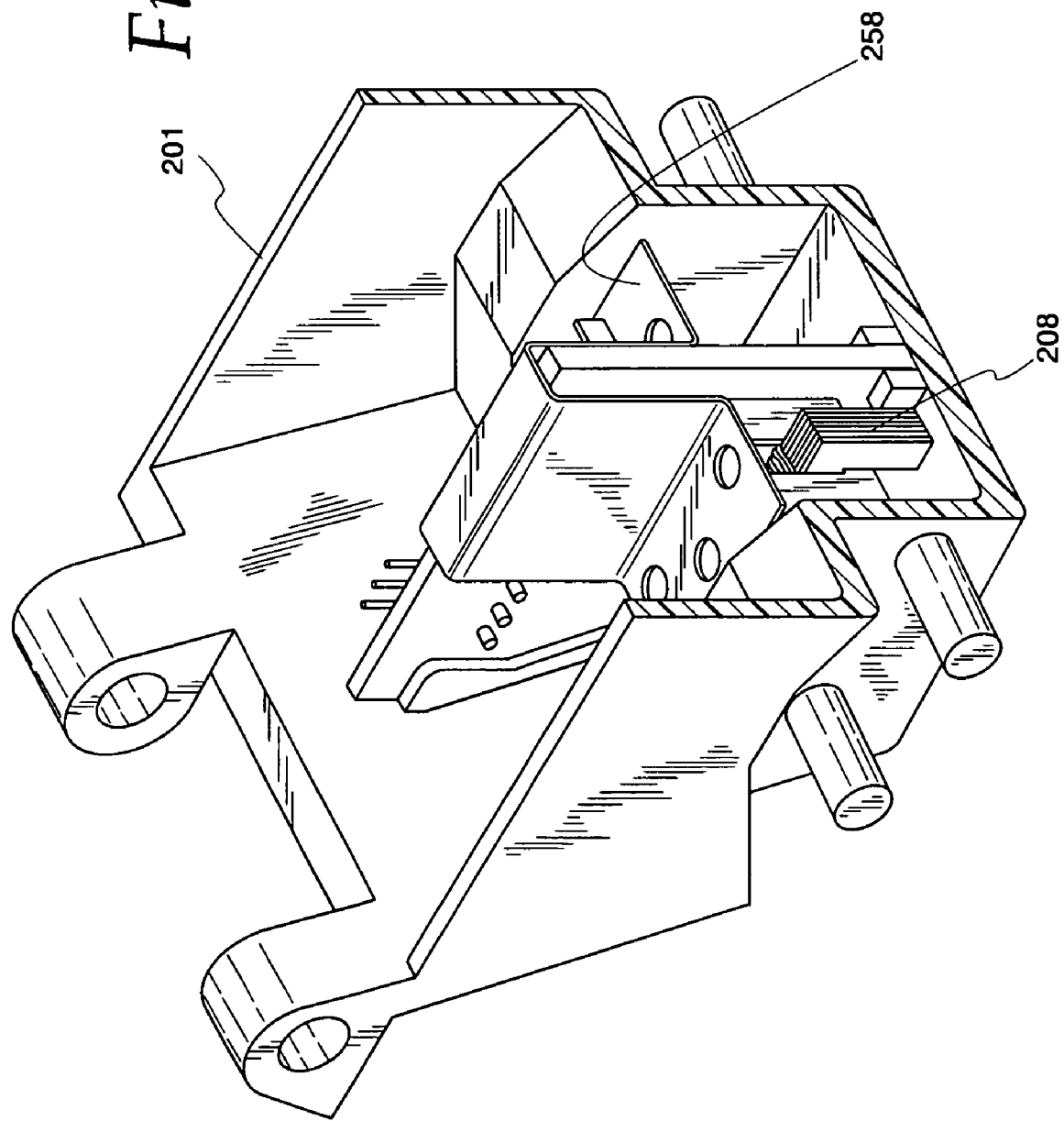

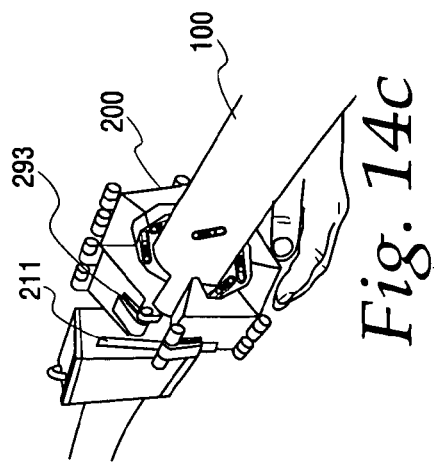
Fig. 14a
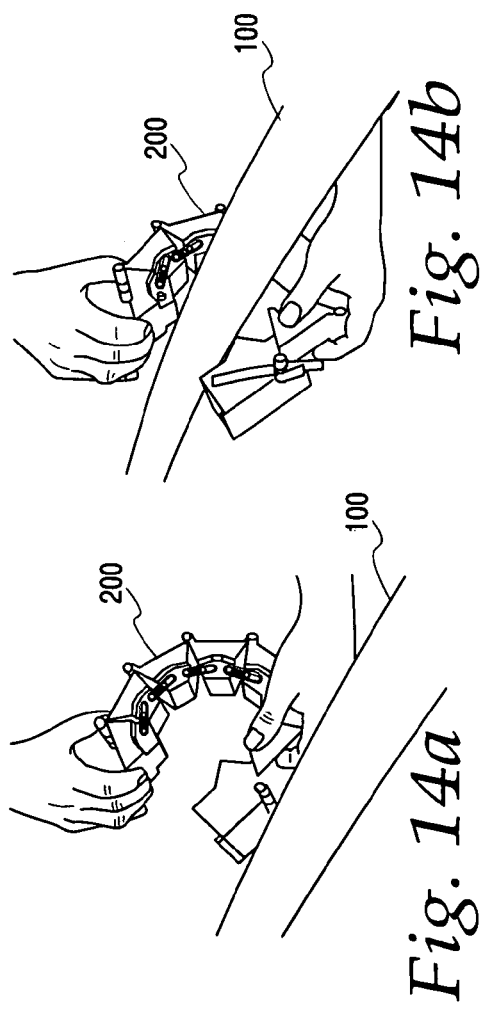
Fig. 14b
Fig. 14d
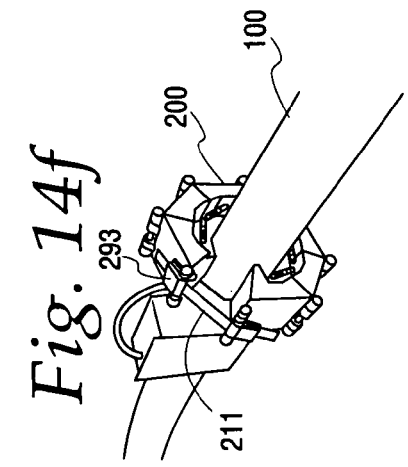
Fig. 14c
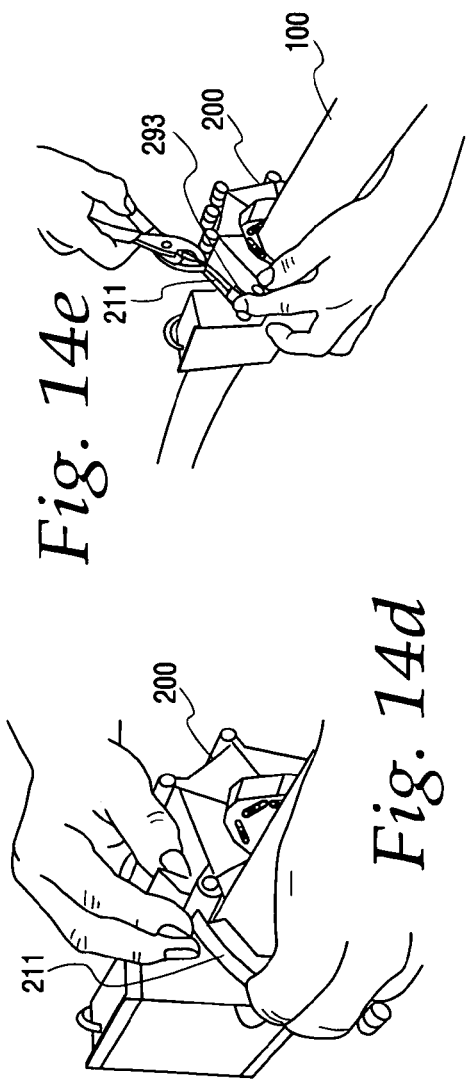
Fig. 14e
Fig. 14f

THREE-PHASE FAULTED CIRCUIT INDICATOR

CROSS-REFERENCE TO RELATED APPLICATIONS

This application claims priority under 35 U.S.C. §119(e) to U.S. Provisional Application 61/042,636, entitled "THREE PHASE FAULTED CIRCUIT INDICATOR," filed on Apr. 4, 2008 on behalf of inventors Edmund O. Schweitzer, III, Laurence V. Feight, Joseph Robert Rauch, and James Manley Duros.

FIELD OF THE INVENTION

The present invention relates generally to systems, apparatus, and methods for indicating the presence of a fault in a power transmission or distribution system, and more particularly, to systems, apparatus, and methods for detecting a phase-to-phase or phase-to-ground fault within a multi-conductor power cable.

DESCRIPTION OF THE PRIOR ART

Various types of self-powered faulted circuit indicators ("FCIs") have been constructed for detecting electrical faults in power distribution systems, including clamp-on type fault indicators, which clamp directly over cables in the systems and derive their operating power from inductive and/or capacitive coupling to the monitored conductor; and test-point type fault indicators, which are mounted over test points on cables or associated connectors of the systems and derive their operating power from capacitive coupling to the monitored conductor. Other prior art FCIs may be either of the manually resetting type, wherein it is necessary that the indicators be physically reset, or of the self-resetting type, wherein the indicators are reset upon restoration of line current. Examples of such FCIs are found in products manufactured by Schweitzer Engineering Laboratories and described in, for example, U.S. Pat. Nos. 3,676,740, 3,906,477, 4,063,171, 4,234,847, 4,375,617, 4,438,403, 4,456,873, 4,458,198, 4,495,489, 4,974,329, 5,677,678, 6,016,105, 6,133,723, 6,133,724, and 6,949,921, all of which are hereby incorporated by reference.

Detection of fault currents in a monitored conductor by an FCI is typically accomplished by magnetic switch means, such as a magnetic reed switch, in close proximity to the conductor being monitored. Upon occurrence of an abnormally high fault-associated magnetic field around the conductor, the magnetic switch actuates a trip circuit that produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position, or the FCI may be manually reset.

U.S. Pat. No. 6,429,661 ("the '661 patent"), is hereby incorporated by reference in its entirety. The '661 patent discloses a fault indicator for three-phase sheathed cables that includes a flexible collar unit which fits over the cable.

Using prior-art multi-conductor FCIs the magnetic sensors must be aligned with individual conductors within a monitored power cable. This requires additional work on the part of the installer. Furthermore, prior-art multi-conductor FCIs only work on a limited range of cable sizes, and also only work on power cables with substantially round conductors. However, since many three-phase power cables used by power distribution systems have sectional topographies, such as the cable illustrated in FIG. 1, an improved FCI would be beneficial.

OBJECTS OF THE INVENTION

Accordingly, it is an object of this invention to provide a three-phase faulted circuit indicator that does not require alignment by an installer.

Another object of this invention is to provide a three-phase faulted circuit indicator that is sizable to accommodate a wide variety of power cables having different diameters.

Another object of this invention is to provide a three-phase faulted circuit indicator that is usable with power cables having elliptical, sectional, or otherwise substantially non-rounded interior conductors.

Other advantages of the disclosed invention will be clear to a person of ordinary skill in the art. It should be understood, however, that a system, method, or apparatus could practice the disclosed invention while not achieving all of the enumerated advantages, and that the protected invention is defined by the claims.

SUMMARY OF THE INVENTION

The disclosed invention achieves these objectives by providing a three-phase faulted circuit indicator adapted to sense current within the internal conductors of a three-phase power cable. In one embodiment, the disclosed faulted circuit indicator comprises a flexible holder adapted to encircle the a monitored three-phase power cable. A plurality of at least four magnetic sensors, such as magnetic coils, are disposed substantially equally distant about the circumference of the flexible holder. Each magnetic sensor is adapted to sense current within an internal conductor of a monitored three-phase power cable, and to generate a voltage that is proportional to the amount of sensed current flowing through the internal conductor. A logic circuit is coupled to each of the magnetic sensors and generates a fault signal when the voltage generated by one or more of the magnetic sensors exceeds a predetermined level. Finally, an output device is coupled to the logic circuit, and indicates the occurrence of a fault when a fault signal is generated. The output device could be a target display, such as, for example, a model PILCL10D04P1 display, manufactured by Schweitzer Engineering Laboratories, Inc. of Pullman, Wash., or a probe wirelessly coupled to a wireless fault indication system, such as, for example, a model PILCM10D04P1, manufactured by Schweitzer Engineering Laboratories, Inc. of Pullman, Wash.

In another embodiment of the disclosed invention, the disclosed faulted circuit indicator comprises four or more sensor compartments, assembled so that each sensor compartment is adjacent to two other sensor compartments, and so that all of the compartments are disposed about a central point. Each sensor compartment further includes a conductor surface with an interior side and an exterior side. The exterior side of the conductor surface is adapted to at least partially contact a three-phase power cable. Further, each sensor compartment is pivotally coupled to the adjacent sensor compartments. In addition, each sensor compartment includes at least one magnetic sensor disposed within the sensor compartment near the interior of the conductor surface. Each magnetic sensor is adapted to sense current within an internal conductor of a monitored three-phase power cable, and to generate a voltage that is proportional to the amount of sensed current flowing through the internal conductor.

A logic circuit is coupled to each of the magnetic sensors and generates a fault signal when the voltage generated by one or more of the magnetic sensors exceeds a predetermined level. Finally, an output device is coupled to the logic circuit, and indicates the occurrence of a fault when a fault signal is generated. The output device could be a target display, such as, for example, a model PILCL10D04P1 display, manufactured by Schweitzer Engineering Laboratories, Inc. of Pullman, Wash., or a probe wirelessly coupled to a wireless fault indication system, such as, for example, a model PILCM10D04P1, manufactured by Schweitzer Engineering Laboratories, Inc. of Pullman, Wash.

In a further refinement of this embodiment of the invention, each sensor compartment includes two posts, and each compartment is coupled to the adjacent compartments by a sliding member disposed on the posts and a spring extending between the posts.

In another embodiment of the disclosed invention, a method of installing a three-phase faulted circuit indicator is disclosed. The three-phase faulted circuit indicator is configured to be installed directly around the outside of a power cable without breaking out the individual conductors within. During installation, the three-phase faulted circuit indicator can be placed so that it is disposed without taking account of the position of the conductors within the power cable. This is accomplished by the installer pulling the ends of the faulted circuit indicator apart to provide an opening that can be slipped over the power cable, placing the FCI over the power cable, and securing the FCI in place.

BRIEF DESCRIPTION OF THE DRAWINGS

Although the characteristic features of this invention will be particularly pointed out in the claims, the invention itself, and the manner in which it can be made and used, may be better understood by referring to the following description taken in connection with the accompanying drawings forming a part hereof, wherein like reference numerals refer to like parts throughout the several views and in which:

FIG. 1 is a cross-sectional view of a three-phase power cable having sectional conductors;

FIG. 2 is a perspective view of a three-phase faulted circuit indicator utilized in accordance with a target-type fault display;

FIG. 3b is a perspective view of the sensor board of FIG. 3a;

FIG. 4a is a side view of a three-phase faulted circuit indicator installed on a three-phase power cable;

FIG. 5a is a perspective view of a three-phase faulted circuit indicator;

FIG. 6 is a top view of two compartments of the three-phase faulted circuit indicator depicted in FIG. 4;

FIG. 6a is a perspective view of a single sensor compartment of the faulted circuit indicator depicted in FIG. 4, including a shield arrangement;

FIG. 6c is an exploded perspective view illustrating the arrangement of a single sensor compartment of the faulted circuit indicator depicted in FIG. 4, including a shield arrangement;

FIGS. 14a-14f depicts the installation process of a faulted circuit indicator.

DETAILED DESCRIPTION OF THE ILLUSTRATED EMBODIMENT

Figure 3:
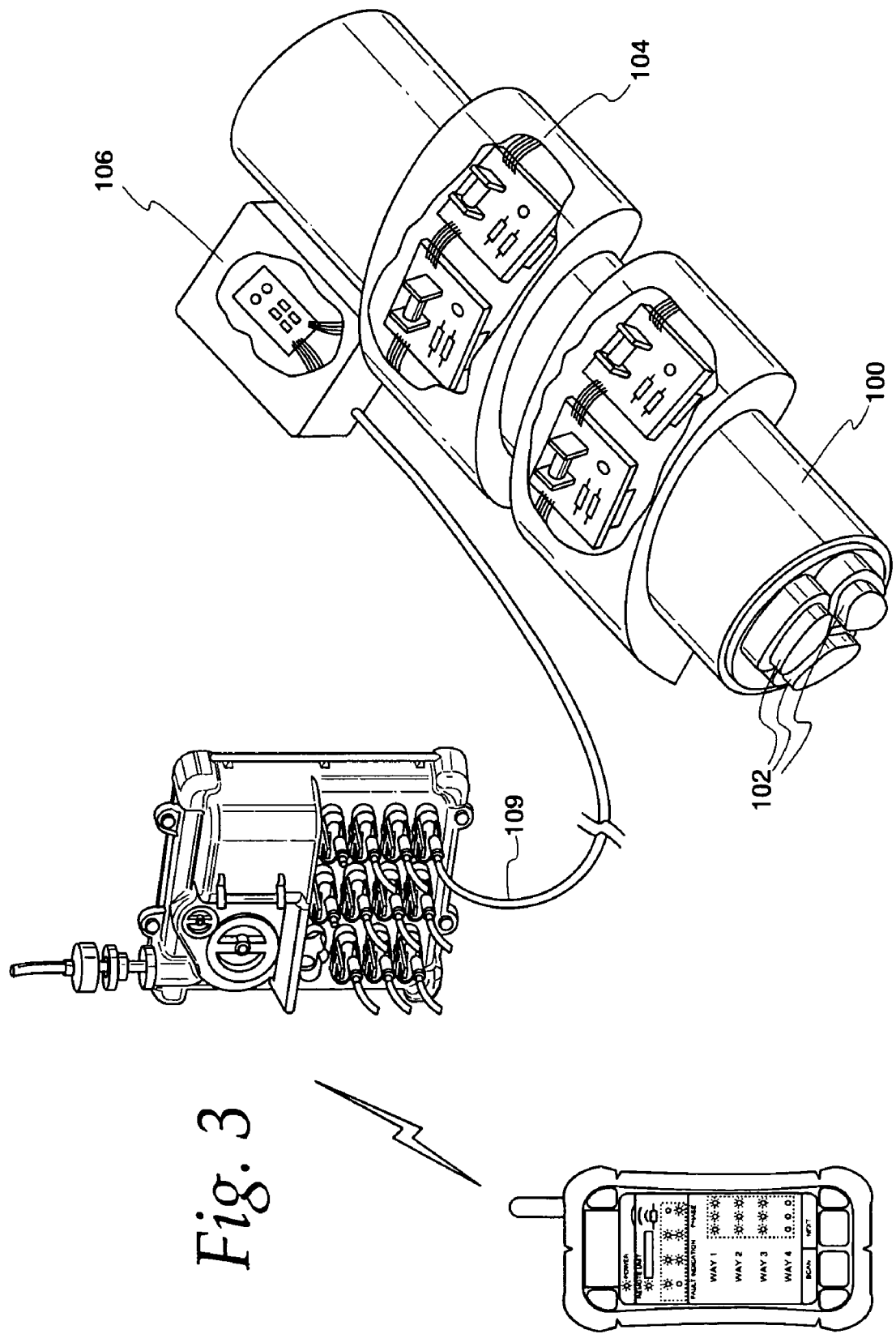
FIG. 3 is a perspective view of a three-phase faulted circuit indicator utilized in accordance with a wireless fault indication system.

Turning to the Figures, and to FIG. 1 in particular, a sectional three-phase power cable is depicted. These types of cables are used for power distribution, and tend to comprise an outer sheath 10, as well as one or more layers of insulation 12, which may comprise, for example, a lead sheath of approximately 0.105 inches (0.267 cm) and a metallized paper binder tape. Three conductors 14 are arranged within the power cable. Each conductor will be insulated from the other by, for example, paper insulation of approximately 0.140 inches (0.356 cm) and a zinc alloy shield tape. As each conductor 14 is comprised of numerous smaller wires (not shown), the topography of the conductors 14 is sectional, as opposed to circular. Further, as the three-phase power cable extends longitudinally, the internal conductors 14 may spiral measurably, thereby changing the placement of the conductors relative to one another along the length of the power cable.

It should be noted that the disclosed three-phase faulted circuit indicators can be used with other power cable configurations. For example, the disclosed three-phase faulted circuit indicators can work with quadraplex cables, where a fourth neutral conductor is included.

FIG. 2 depicts one possible embodiment of a three-phase faulted circuit indicator designed to detect currents in all three conductors of a three-phase power cable. In the depicted embodiment, a three-phase power cable 100 with sectional internal conductors 102 is monitored by a three-phase faulted circuit indicator 103. The three-phase faulted circuit indicator 103 includes a flexible sheath 104, a logic housing 106, and a fault display 108. In one embodiment, the flexible sheath 104 could comprise multiple layers, with electronic modules, cables, and other items being disposed between the layers. Alternatively, the flexible sheath 104 could comprise a single layer, with the sheath being formed around any required electronic modules, cables, etc. Sensing units comprising, for example, magnetic coils with supporting circuitry, are disposed within the flexible sheath 104 at periodic intervals so as to sense the currents present in the internal conductors 102 of the monitored three-phase power cable 100. It should be noted that if a traditional display is used a sufficient length of cable would be required to place the display in a location viewable by maintenance personnel. For example, the FCI could be installed on an underground cable, and the display would need to be located in a maintenance vault or similarly accessible location, which could require 25 or more feet of cable.

FIG. 3 is an alternative perspective view of the three-phase faulted circuit indicator of FIG. 2. In this view, the display has been replaced by a probe 109 for use with a wireless fault indicating system, such as the RADIORANGER® system available from Schweitzer Engineering Laboratories, Inc. of Pullman, Wash. The sensing units utilized by this embodiment of the disclosed three-phase faulted circuit indicator could be the sensor and amplifier circuitry depicted in FIGS. 3a and 3b, discussed in the text accompanying those figures. The logic circuitry housed within the logic housing 106 could be the logic circuitry disclosed later within this application, or any other suitable prior art faulted circuit logic circuitry adaptable to function with a three-phase faulted circuit indicator. In addition, the flexible sheath 104 is adapted to encircle the three-phase power cable 100 with more than one revolution. The flexible sheath 104 is further adapted to tightly couple to the power cable 100; for example, by securing the flexible sheath 104 to the power cable 100 with a tie, glue, or some other means.

Similarly to systems utilizing a traditional display, the cable connecting the probe to the FCI must be of sufficient length to reach the wireless reporting unit, or, alternatively, the probe may wirelessly couple with the wireless reporting unit.

It will be apparent to persons of skill in the art that this embodiment of the disclosed invention can accommodate a wide variety of sizes of power cable, as long as the flexible sheath can complete one full revolution around the monitored power cable.

Installation of this embodiment of the disclosed invention will be simple for maintenance personnel. As opposed to breaking out individual conductors and mounting a faulted circuit indicator to each conductor, the disclosed faulted circuit indicator will simply be mounted around a three-phase power cable. The faulted circuit indicator may be attached by glue or tape, or it may be bound to the power cable using rope, or some other means. Given the periodic placement of magnetic sensors throughout the surface of the disclosed, no additional procedure is required to precisely place the sensors in relation to the individual conductors contained within the three-phase power cable. In addition, there is no requirement that the individual conductors are round or any other shape.

Figure 3B:
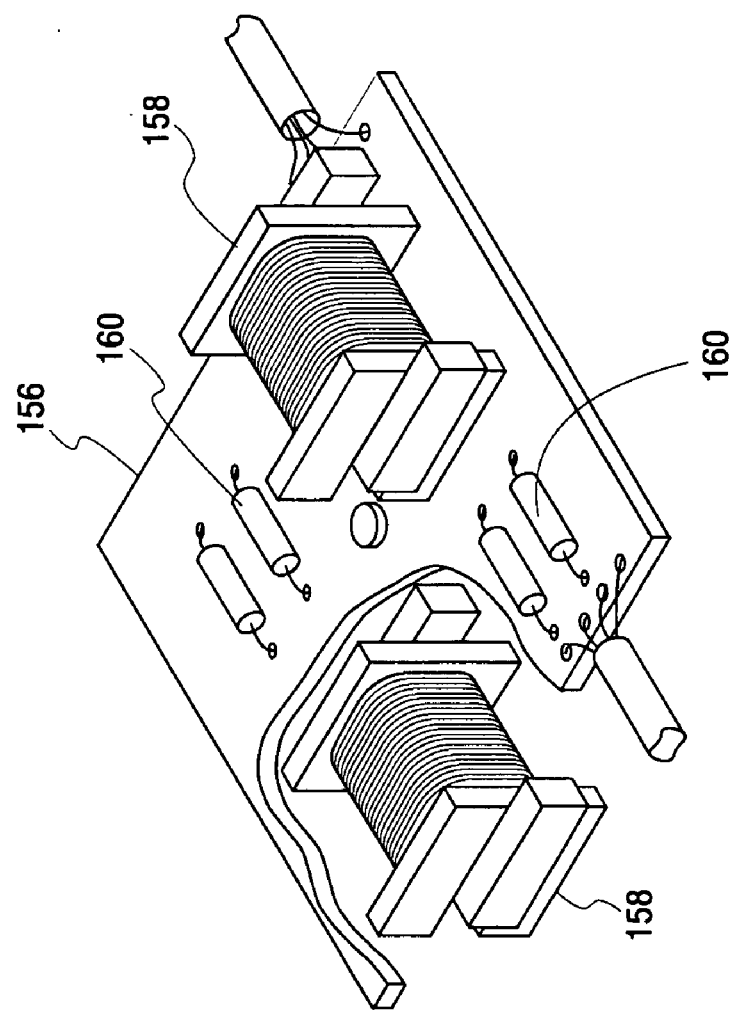
Figure 3A:
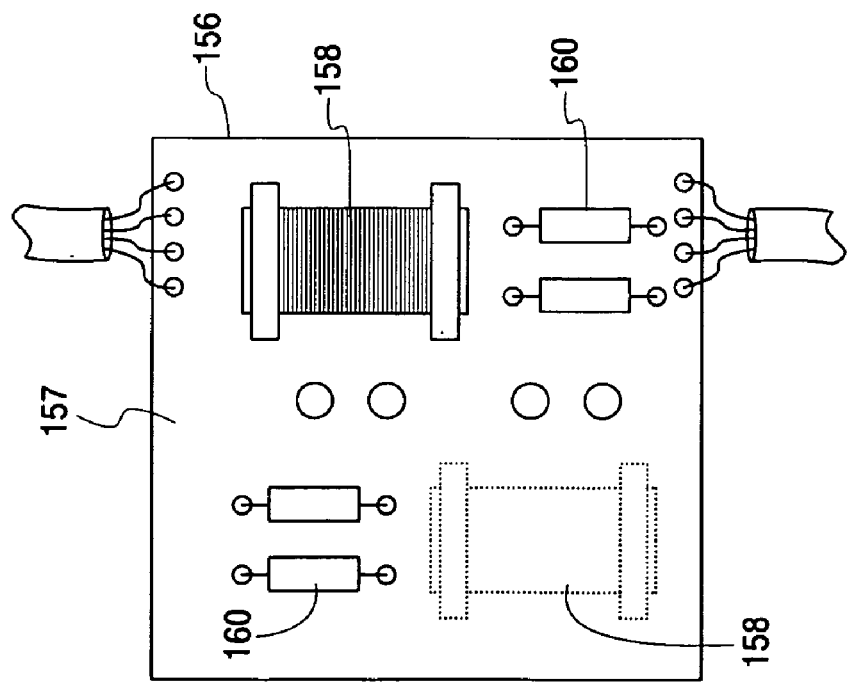
FIG. 3a is a top view of a sensor board for use with the three-phase faulted circuit indicator of FIG. 1.

FIGS. 3a & 3b depict one possible implementation of a sensor board 156 for use with the faulted circuit indicator depicted in FIGS. 2 and 3. As depicted the sensor board 156 comprises two magnetic sense coils 158 disposed on opposite sides of a printed circuit board 157. Each sense coil 158 is responsive to the magnetic field of a monitored conductor, and will produce a signal that tracks the current within the monitored conductor. Additional support circuitry 160 is used to determine if the acquired signal is above a predetermined level, which would be indicative of a fault on the monitored conductor. The fault indications are wire-orred together on the board, and bussed to other sensor boards and a logic board, along with power and ground signals.

Figure 4:
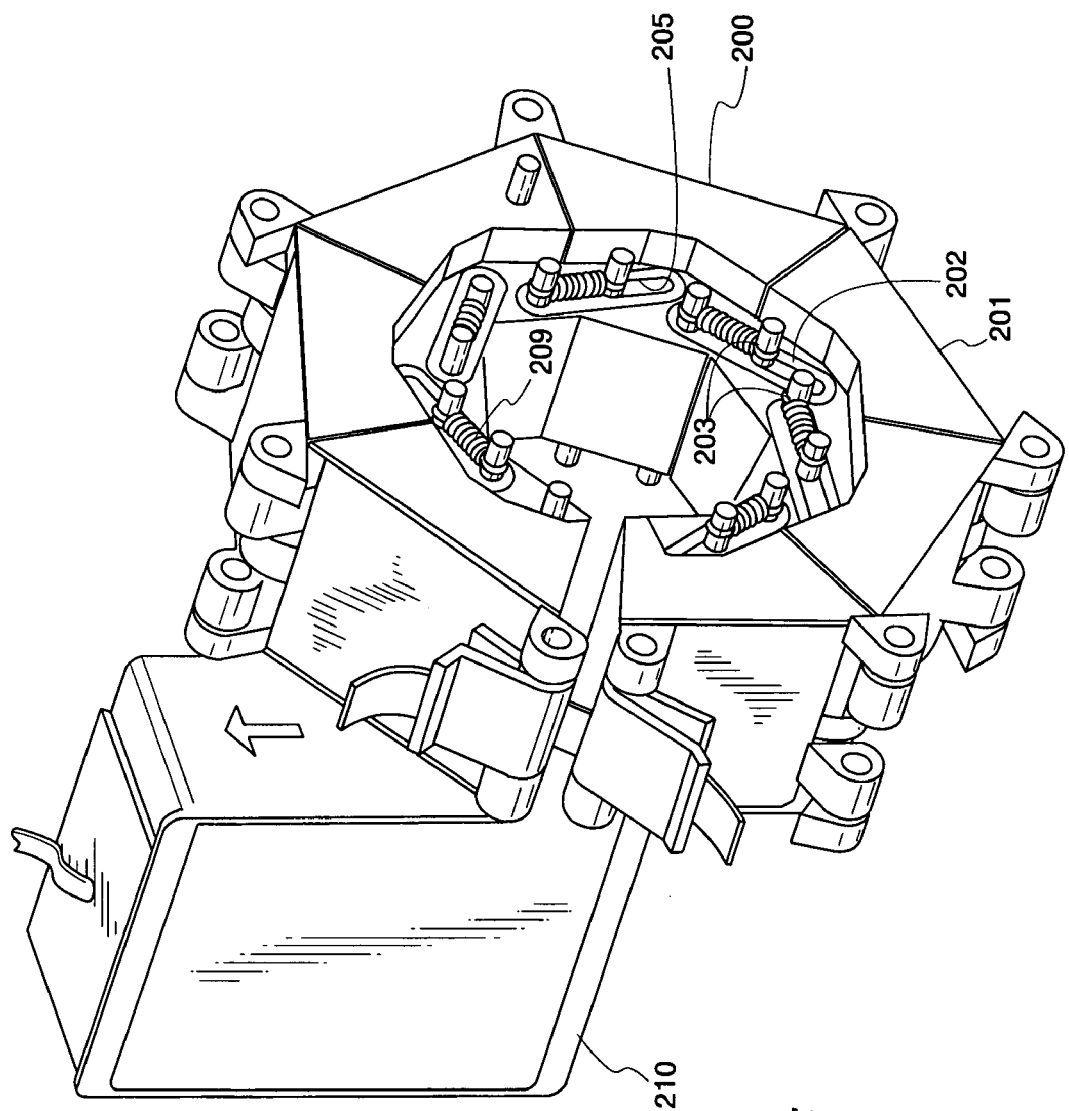
FIG. 4 is a perspective view of a three-phase faulted circuit indicator.

FIG. 4 depicts another three-phase faulted circuit indicator constructed in accordance with the disclosed invention. As depicted, a three-phase faulted circuit indicator 200 is constructed from seven interlocking sensor compartments 201. Each sensor compartment 201 has a pair of posts 203 on each side positioned toward the center of the faulted circuit indicator 200, with each post 203 connected to an adjacent post 203 on an adjacent sensor compartment 201 by a sliding member 202. The sliding member 202 is constructed so that one end is snugly anchored by a post 203, while the other end includes a channel 205 cut through the sliding member 202, allowing another post 203 to slide for a limited distance along the sliding member 202. Each sensor compartment 201 of the faulted circuit indicator 200 is also joined by one or more retaining springs 209 to its neighbors. Each retaining spring 209 mounts on the same pair of posts 203 as a corresponding sliding member 202. When installed, the spring force from each retaining spring 209 pulls the compartments which it couples together, so that the three phase faulted circuit indicator stays securely mounted to the monitored power cable. Note that the posts 203, sliding members 202, and retaining springs 209 are disposed on both sides of the faulted circuit indicator. A logic compartment 210 is further coupled to the faulted circuit indicator 200. To protect against wear as well as contaminants, such as metal fragments, the interior of each sensor compartment and the logic compartment is closed off. One way this could be accomplished would be by filling each compartment with potting material.

The compartments may be made of any solid, insulative material. For example, molded plastic has been found to work well, and in particular, allows all compartments for the faulted circuit indicator to be made from two separate designs. The first produces the sensor compartments, and the second produces a sensor compartment molded directly to a logic compartment.

FIG. 4a depicts the faulted circuit indicator of FIG. 4 installed on a power cable. As shown, a strap 211 is used to tightly fasten the faulted circuit indicator to the monitored power cable. In addition, an "up" arrow 213 is depicted on the logic compartment. This indicator is only required when the indicator is powered by certain batteries that perform best when mounted in a certain orientation, or can give a longer life when mounted in a certain orientation.

Figure 4B:
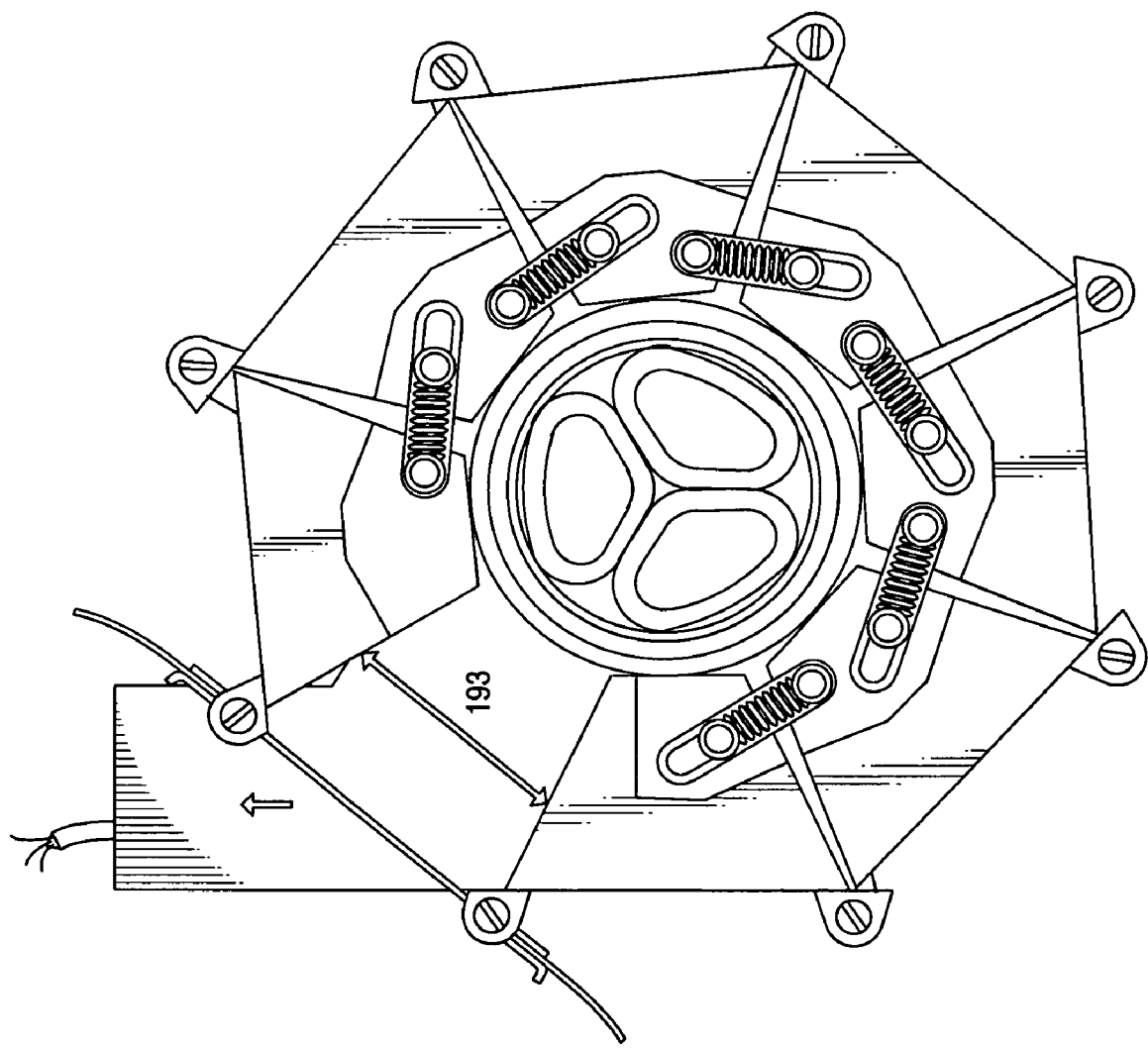
FIG. 4b is a side view of a three-phase faulted circuit indicator installed on a large three-phrase power cable.

FIG. 4b depicts the faulted circuit indictor of FIG. 4 installed on a large power cable. As shown, there is a gap 193 between the sensor compartments. However, sensors disposed within the logic compartment will provide coverage for this area.

FIG. 5a is an alternative perspective view of the three-phase faulted circuit indicator depicted in FIG. 4. As shown, a three-phase power cable 100 with sectional internal conductors 102 is monitored by a three-phase faulted circuit indicator 200. As depicted, the three-phase faulted circuit indicator fits snugly about the monitored power cable 100. However, a larger conductor could be accommodated, which would result in a gap between two of the sensor compartments 201, for example, between sensor compartment 222 and sensor compartment 223.

Each sensor compartment 201 includes a sensor board 206. Each sensor board 206 includes one or more magnetic flux sensing coils 208, disposed on the sensor board 206 and within the sensor compartment 201 so that it is near the bottom wall of the sensor compartment 201, thereby allowing it to be disposed physically close to a monitored three-phase power cable. Each sensor board 206 also includes support circuitry to aid in acquiring a representation of the current flowing in one of the internal conductors of a monitored three-phase power cable. The logic compartment 210 includes a logic board 212 with sensing circuitry, as well as circuitry required to determine if the signals acquired by any of the sensor boards indicates a fault on one or more of the internal conductors of a monitored three-phase power cable.

The sensors 208 within each individual compartment 201 are positioned such that one sensor 208 in an individual compartment 201 would be offset axially relative to each other along the longitudinal axis of the monitored power cable 100 when installed thereon. Further, the sensors 208 are offset within each individual compartment 201 such that the sensors 208 would be offset circumferentially relative to each other and the monitored power cable 100 when installed thereon. Such axial and/or circumferential offset in the sensors 208 assists in detecting faults regardless of rotational position by "filling in the gaps" of the magnetic fields from the individual conductors. Such axial and/or circumferential offset also eliminates the requirement that the faulted circuit indicator 200 be positioned such that sensors 208 are directly adjacent to the individual conductors. This is especially beneficial due to the difficulty of such positioning imposed by individual conductor shape, twisting of the conductors axially along the length of the monitored power cable, and the like. Furthermore, a minimum spacing is maintained between the magnetic sensors to prevent adjacent sensors from monitoring the same magnetic flux emissions from the power cable. If such a minimum distance was not maintained, a discrete magnetic flux emissions would be monitored by two or more magnetic sensors, with the tracking signals output from the magnetic sensors lowered according to the amount of magnetic flux monitored by each.

Figure 5B:
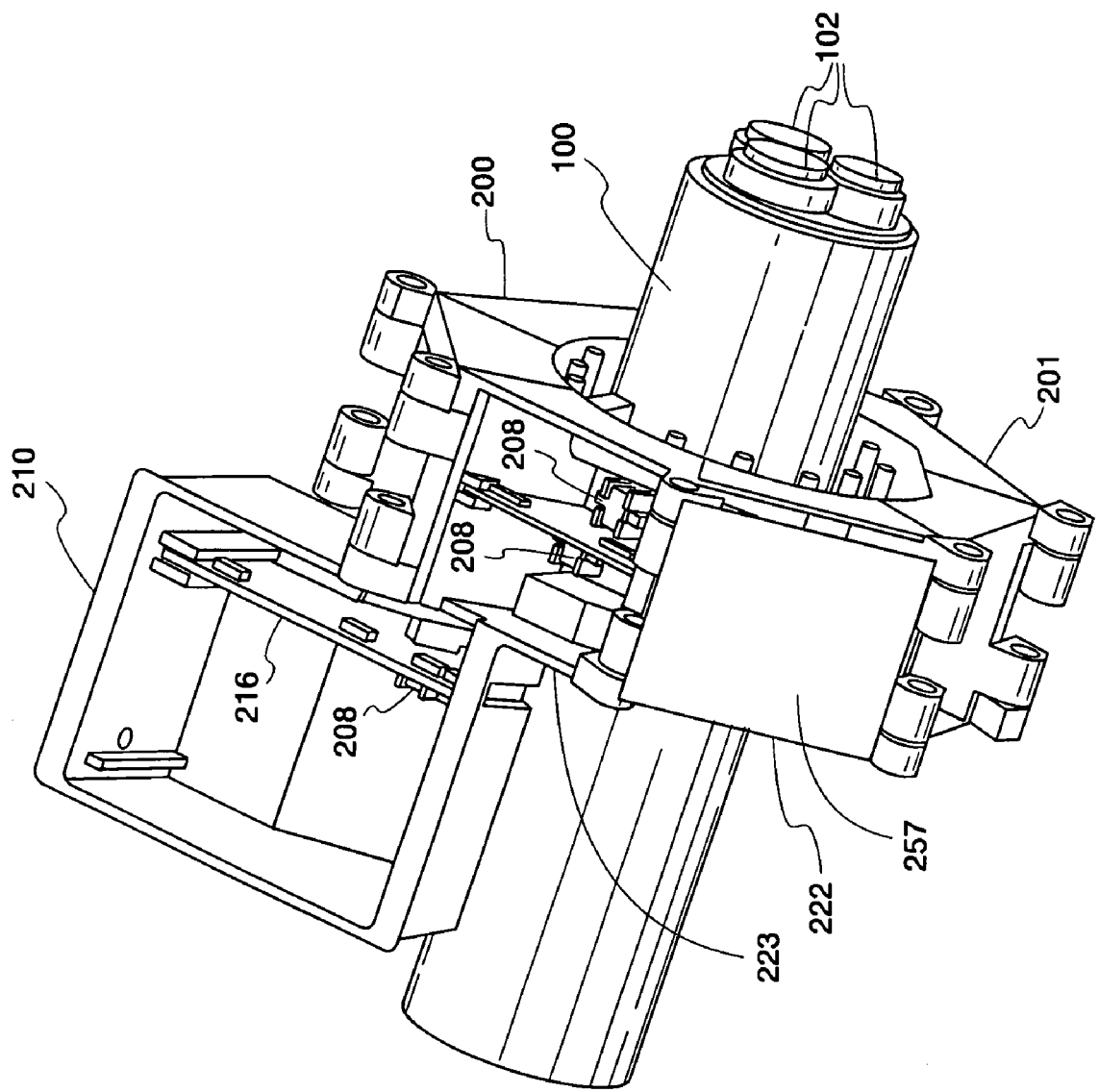
FIG. 5b is a perspective view of a three-phase faulted circuit indicator.

FIG. 5b illustrates an alternative perspective view of the three-phase faulted circuit indicator depicted in FIG. 4. As shown, the compartment 222 is illustrated with a shield 257 installed. The shield is composed of a material selected to shield the sensors 208 from electromagnetic forces originating from other than the monitored conductor 100. For example, in a situation where another conductor runs proximate to the monitored conductor 100, the electromagnetic forces produced by current on the other conductor may interfere with the sensors 208 causing incorrect operation. To lessen this likelihood, compartments 222 may be fitted with a shield 257. The shield may be installed such that it overlaps with shields of other compartments such than no gaps are left between compartments. The shield may further include bends, angles, or the like to facilitate such overlapping or to fill gaps in shielding between compartments.

Figure 5D:
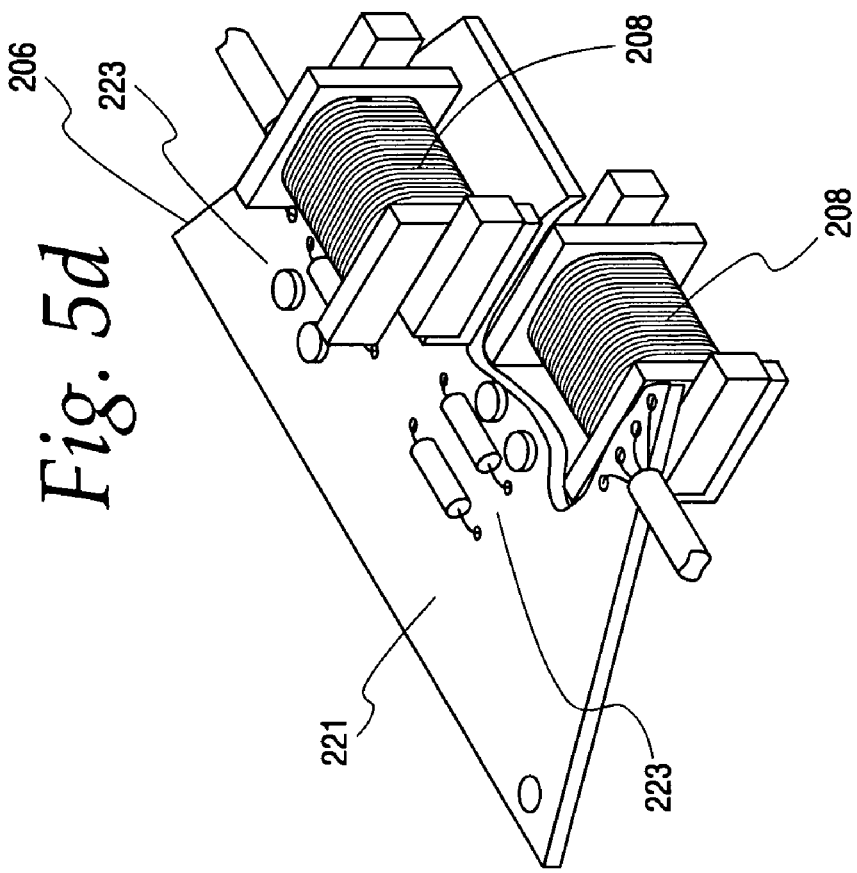
FIG. 5d is a perspective view of the sensor board of FIG. 5c.
Figure 5C:
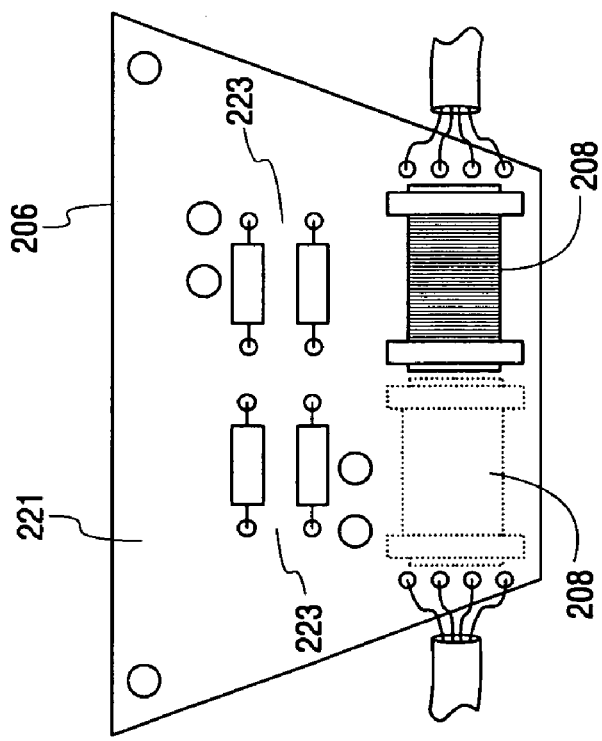
FIG. 5c is a top view of a sensor board for use with the three-phase faulted circuit indicator.

FIGS. 5c and 5d depict one possible implementation of a sensor board 206 for use with the faulted circuit indicator 200 depicted in FIG. 4. As depicted, the sensor board 206 is trapezoidally shaped and comprises two magnetic sense coils 208 disposed on opposite sides of a printed circuit board 221. Each sense coil 208 is responsive to the magnetic field of a monitored conductor, and will produce a signal that tracks the current within the monitored conductor. Additional support circuitry 223 is used to determine if the acquired signal is above a predetermined level, which would be indicative of a fault on the monitored conductor. The fault indications are wire-orred together on the board 221, and bussed to other sensor boards and a logic board, along with power and ground signals.

FIG. 6 is a top view of a sensor compartment 201 and the logic compartment 210 of the faulted circuit indicator of FIGS. 4, 5a and 5b. As depicted, both compartments are molded as a single piece of plastic. The sensor compartment 201 holds a sensor board 206, with a pair of coils 208 disposed somewhat offset from one another to permit optimal sensing of any current flowing through a monitored conductor. The logic compartment holds a logic board 212 including a pair of coils 208 similarly disposed offset from one another. Again in FIG. 6 it can be seen that the sensors 208 would be offset axially from one another in relation to the center axis of the power cable and/or a circumferentially relative to each other and the monitored power cable when installed thereon.

Figure 6B:
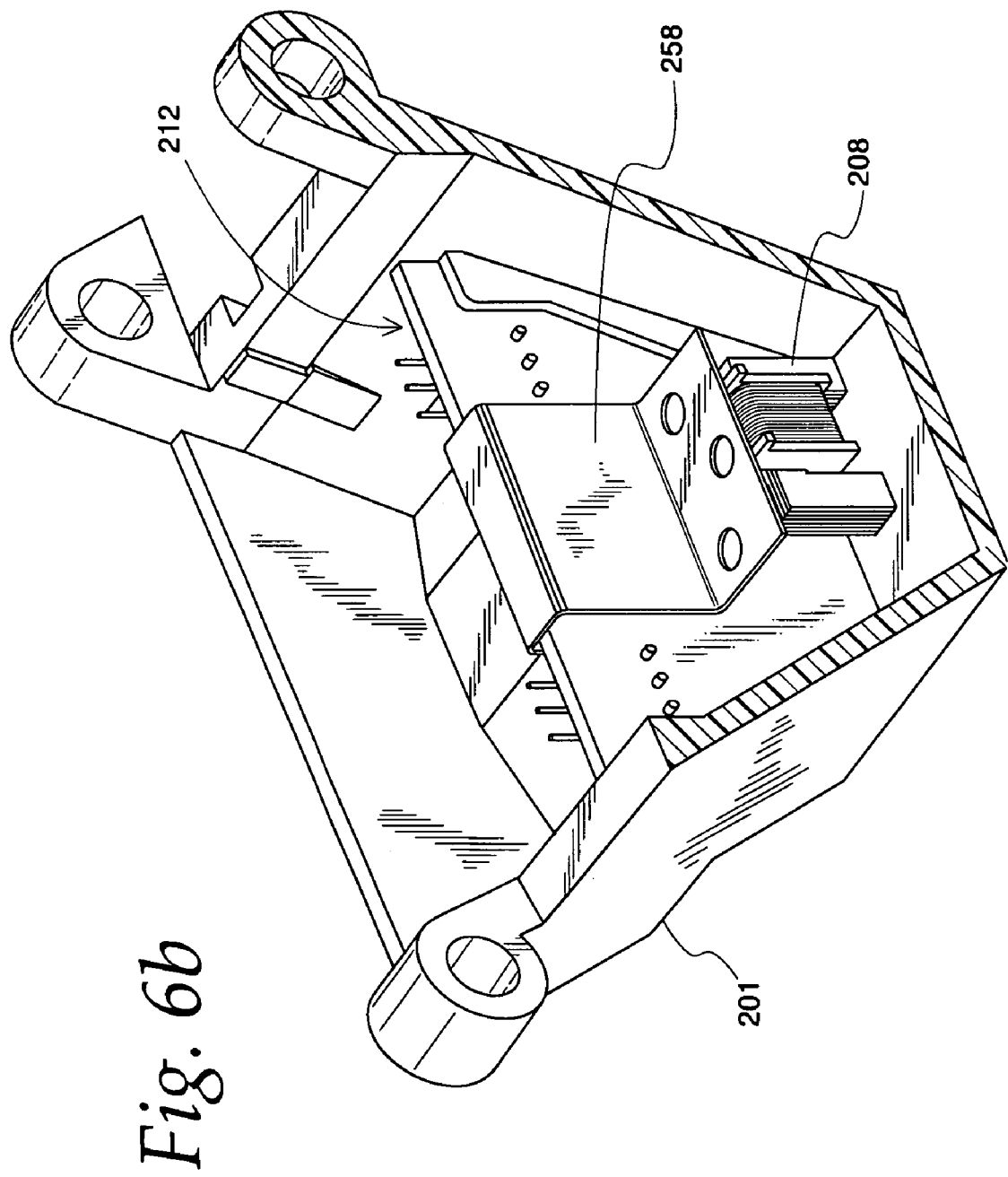
FIG. 6b is an exploded perspective view depicting the side of a single sensor compartment of the faulted circuit indicator depicted in FIG. 4, including a shield arrangement.
Figure 6D:
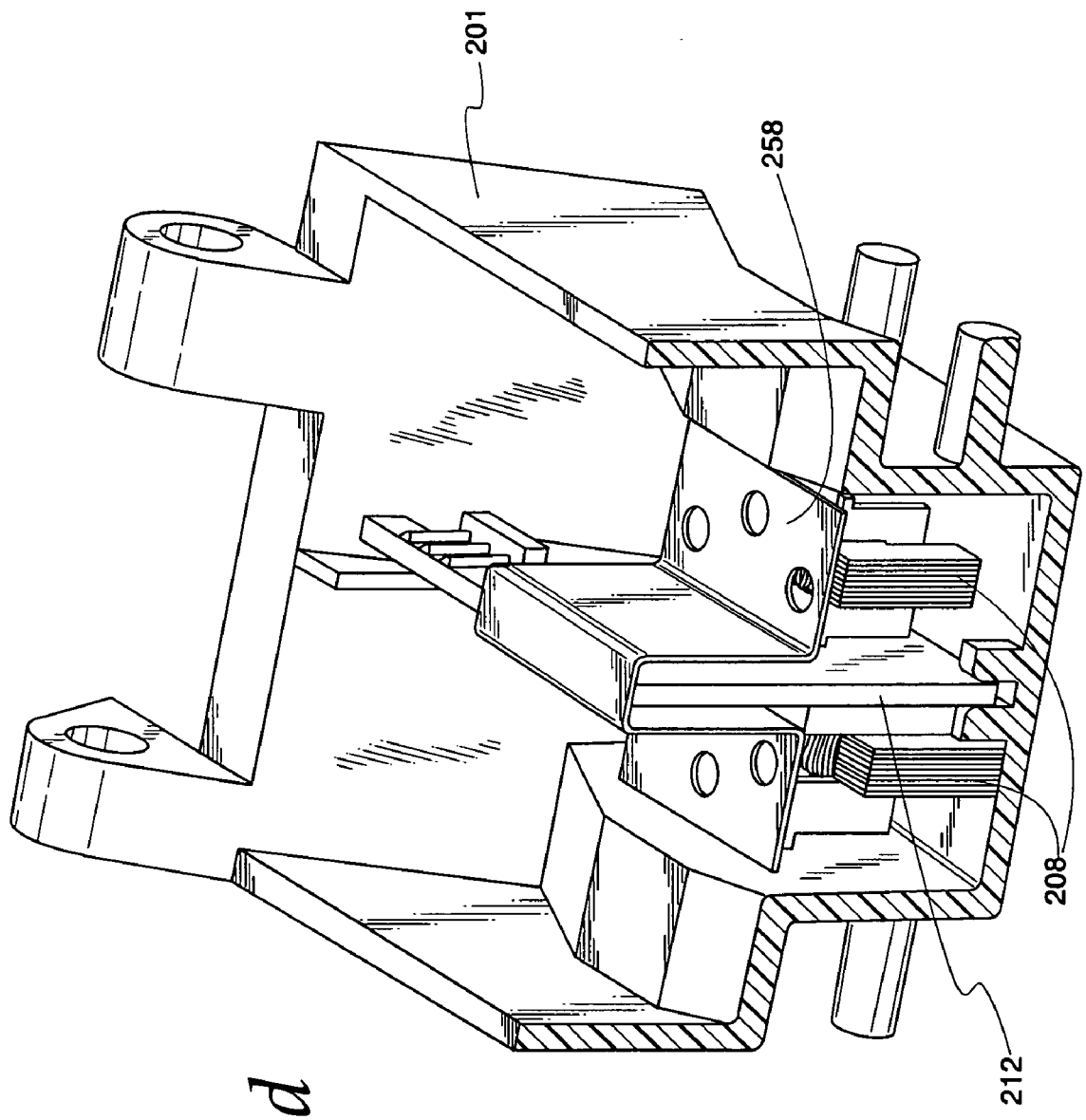
FIG. 6d is a exploded perspective view illustrating the placement of shield arrangement within a single sensor compartment of the faulted circuit indicator depicted in FIG. 4.
Figure 6E:
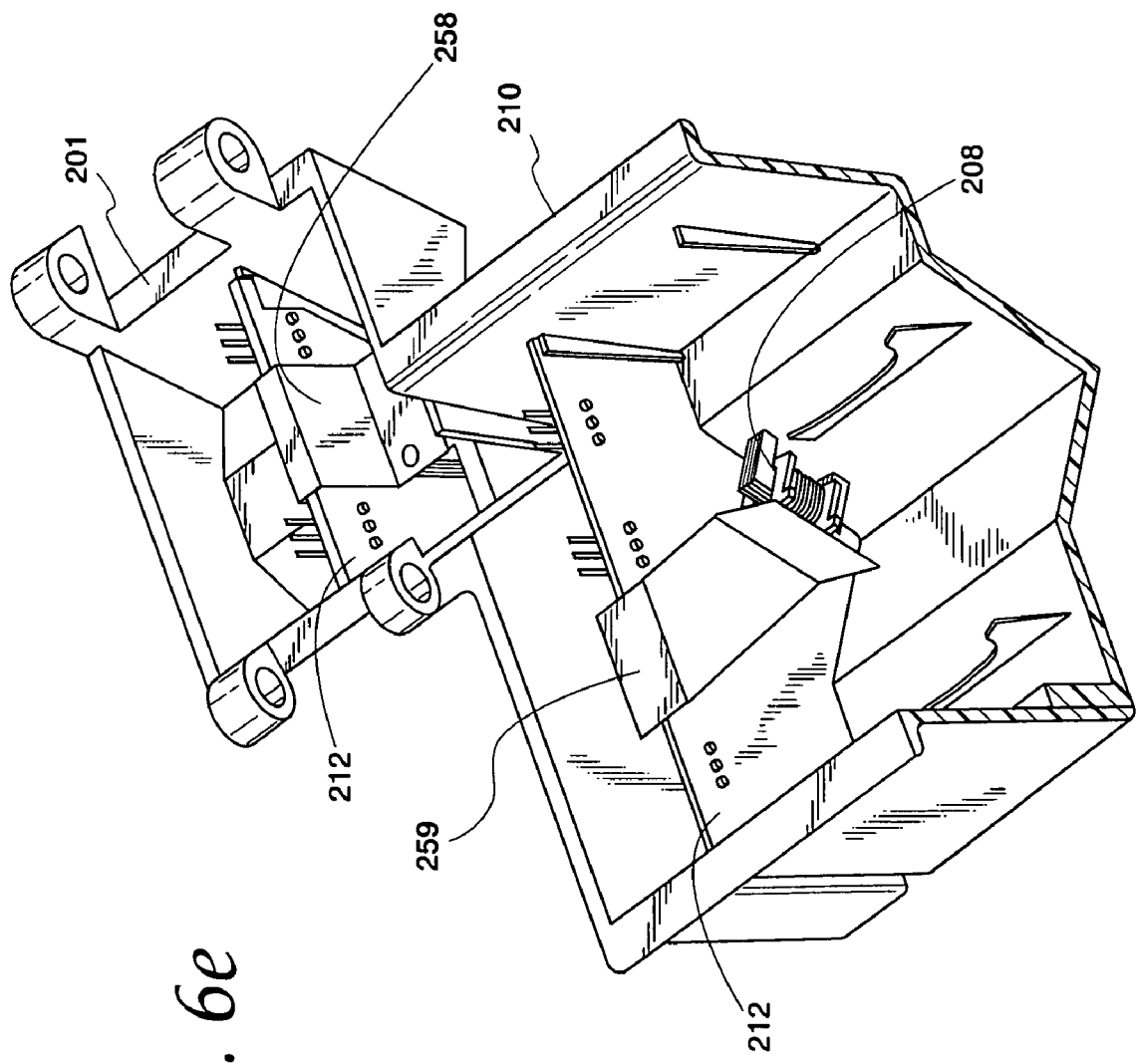
FIG. 6e is a perspective view illustrating a logic compartment molded to a sensor compartment as used within the faulted circuit indicator depicted in FIG. 4, including a shield arrangement.

An alternative shield arrangement for the faulted circuit indicator depicted in FIG. 4 is illustrated in FIGS. 6a-6e. As shown, this arrangement disposes the shield 258 extremely close to the magnetic sensors 208 on the side of the magnetic sensor 208 away from where the power cable would be situated. This arrangement provides excellent immunity against interference from other power conductors situated close to the monitored power cable. FIG. 6a depicts the placement of the shield 258 over the magnetic sense coils (partially shown) within a sensor compartment 201. FIG. 6b illustrates how the shield 258 covers substantially all of the upper surface of a sense coil 208, thereby immunizing the sense coil 208 from magnetic flux originating past the shield 258. FIG. 6c depicts a lateral slice of a compartment 201 with the shield 258 installed. FIG. 6d depicts an alternative lateral slice of a compartment 201 with the shield 258 installed. FIG. 6e depicts the placement of the shield 259 within the logic compartment 212.

Figure 7:
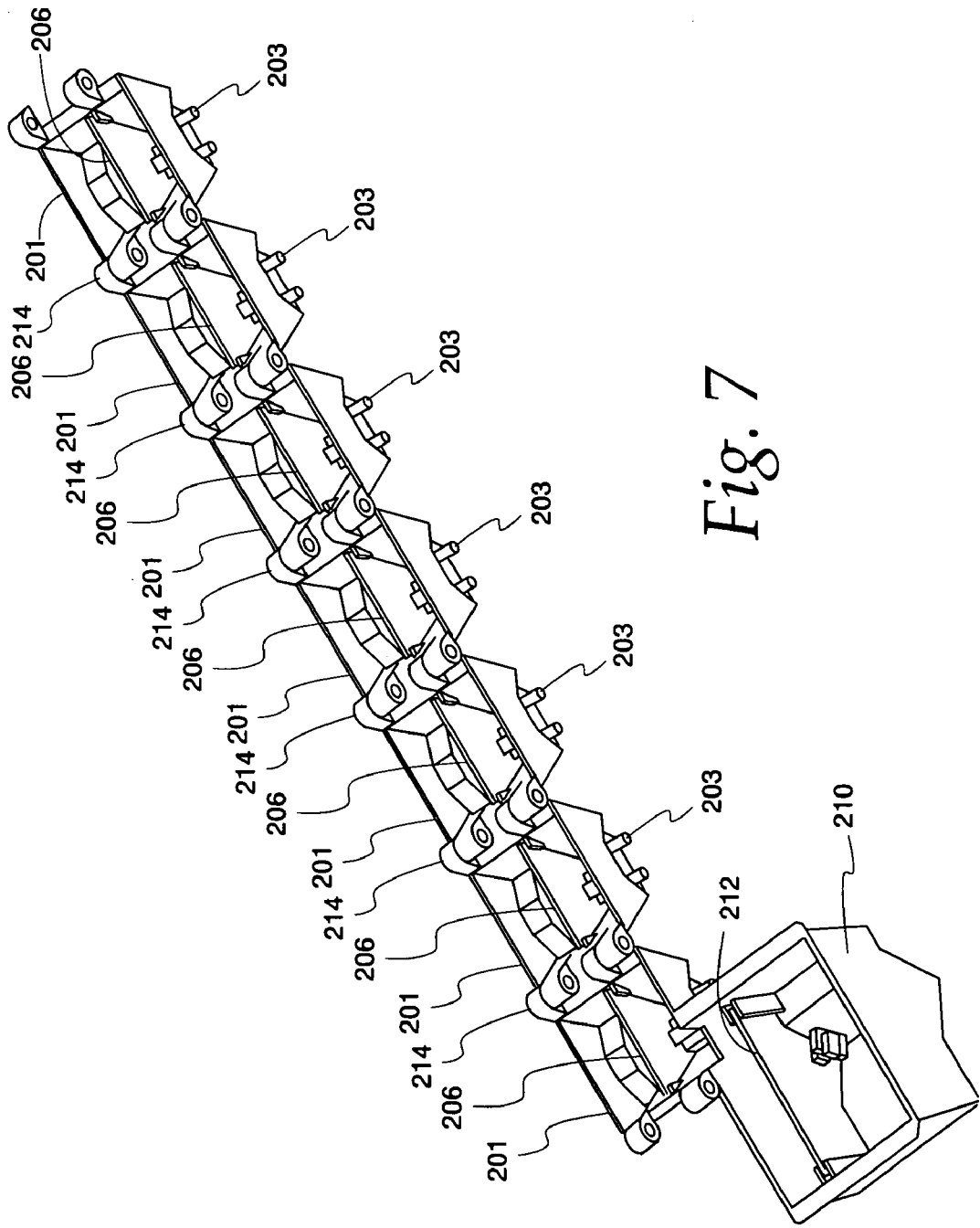
FIG. 7 is a perspective view of the three-phase faulted circuit indicator of FIG. 4, wherein all retaining springs and sliders have been removed allowing all compartments of the faulted circuit indicator to lay flat.

FIG. 7 is a perspective view of the entire faulted circuit indicator of FIGS. 4, 5a, and 5b, but with the sliding members and restraining springs removed, so that all compartments can lay side by side in a fully extended manner. As can be seen, when the different compartments are reconnected, the three-phase faulted circuit indicator 200 can be adjusted to accommodate a wide variety of power cables having different sizes. For power cables with a larger radius, the amount of overlap may be lessened, or, if necessary, one or more additional compartments 201 may be added. To accommodate smaller cables, one or more compartments 201 may be removed. However, this will cause the faulted circuit indicator to be more dependent on the rotational angle with which it is mounted to the power cable. Accordingly, the compartments 201 could also be shrunk to accommodate smaller power cables. Each compartment is joined to the adjacent compartments by a rotating member 214, such as a hinge or rotatable joint. In addition, a series of posts 203 serve as mounting points for springs to compress the depicted faulted circuit indicator when mounted on a power cable.

Figure 8:
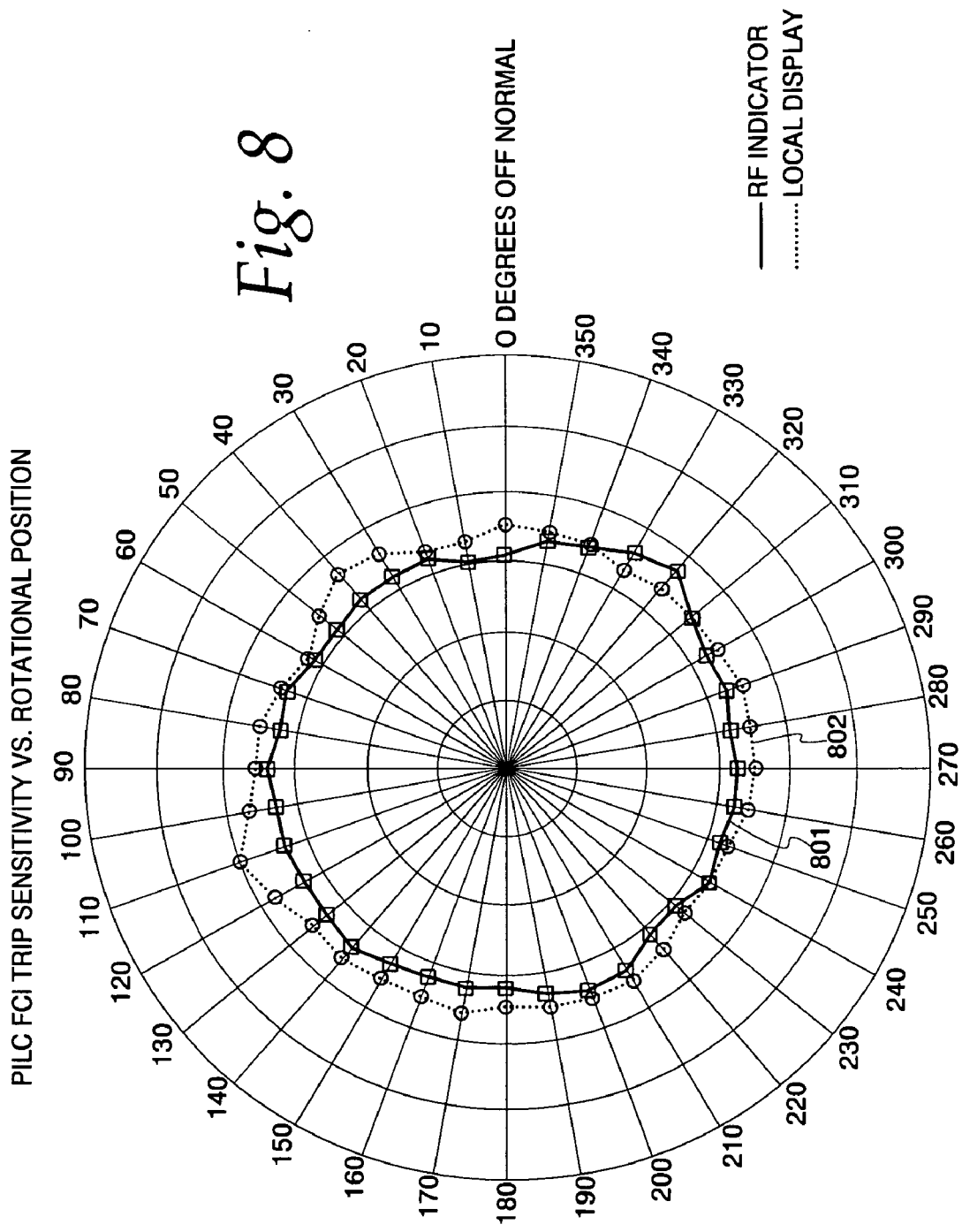
FIG. 8 is a chart depicting the measured trip current of one embodiment of the three-phase faulted circuit indicator of FIG. 4 at different rotational positions about a sectional three-phase conductor for two separate indicator probes.

FIG. 8 depicts the trip sensitivity of the three-phase faulted circuit indicator 200 of FIGS. 4 and 5 versus its angle of rotation about an exemplary three-phase power cable. As depicted, the solid line 801 shows the trip sensitivity when the faulted circuit indicator is coupled to a wireless fault indicating system, while the dashed line 802 shows the trip sensitivity when the faulted circuit indicator is coupled to a local display. In both cases, the trip value varies only slightly based on rotation of the faulted circuit indicator about the monitored three-phase power cable.

Figure 9:
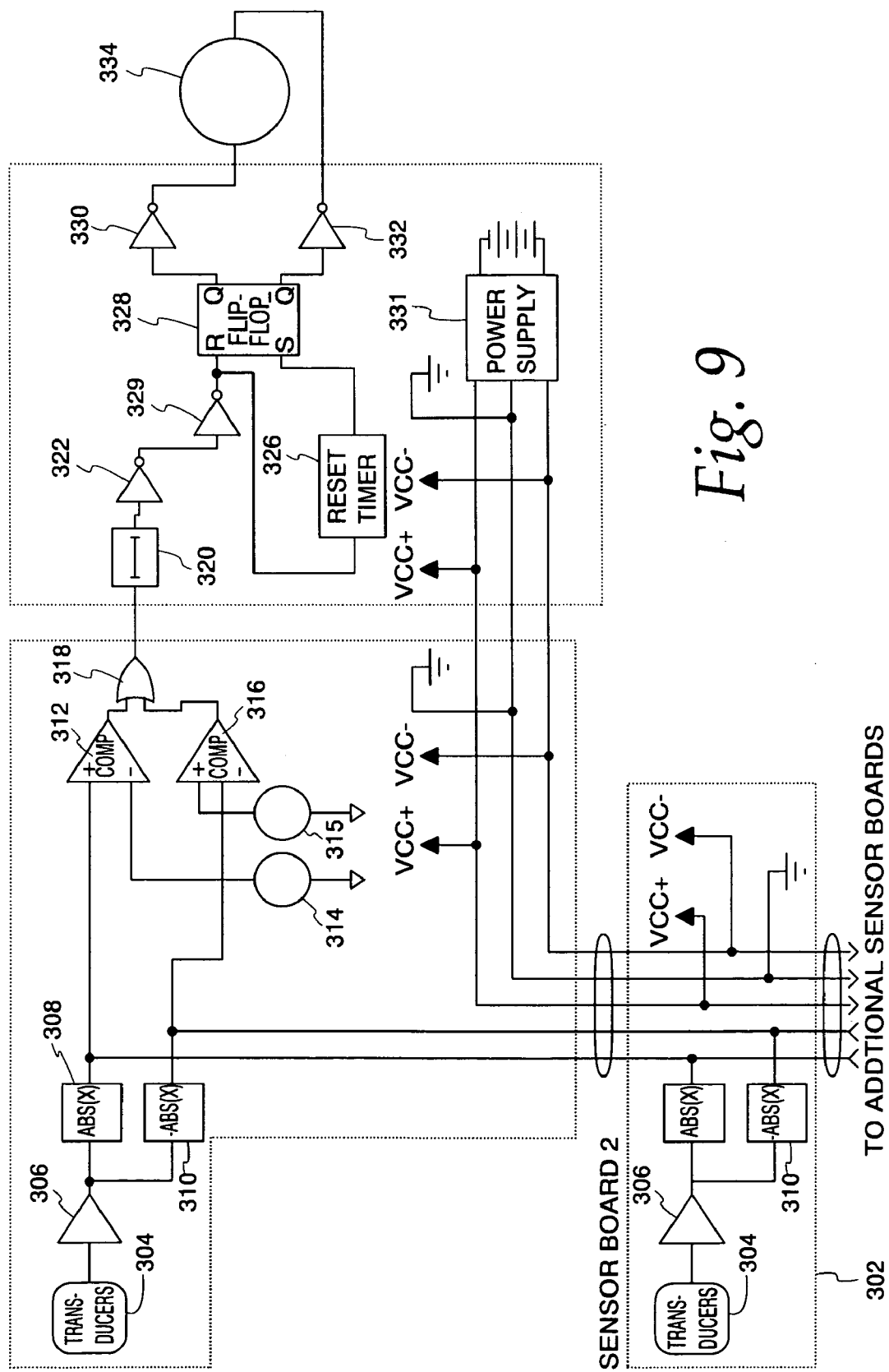
FIG. 9 is a simplified schematic block diagram depicting one possible implementation of circuitry for use with the three-phase faulted circuit indicator of FIG. 4.

FIG. 9 is a simplified schematic block diagram depicting a circuit for use with either embodiment of the disclosed faulted circuit indicator. A plurality of sensor boards 302 are used to sense current in the monitored conductors. Each sensor board 302 comprises a transducer 304 for acquiring a signal representative of AC current within a monitored conductor, an amplifier block 306 for amplifying the acquired signal, and a pair of absolute value blocks 308,310 for generating a positive absolute value signal and negative absolute value signal corresponding to the acquired and amplified signal. The positive absolute value signals of all of the sensor boards are wire-orred together, and fed into a first comparator 312 where they are compared against a first reference voltage 314. Similarly, the negative absolute value signals of all of the sensor boards are wire-orred together and fed into a second comparator 316, where they are compared against a second reference voltage 315.

The results of both comparisons are passed through an OR block 318, which will output a high signal if either comparator 312 or 316 results in a positive comparison. The output of OR block 318 is passed through a delay block 320, which requires that the output of OR block 318 remain high for some period of time before providing an output, and thus effectively providing a "trip delay." Potential values for delay block 320 are 8.3 ms, 16.7 ms (one cycle at 60 Hz), 24 ms, 50 ms, or any other time value. The output of delay block 320 is passed through a pair of inverters 322, 329, and into the reset input of flip-flop 328, as well as into the input of reset timer 326. The output of reset timer 326 is routed into the set input of flip-flop 328. Reset timer 326 provides a time period for resetting the state of the faulted circuit indicator after a fault has been detected. Some example times that reset timer 326 could be set to are 1 hour, 2 hours, 4 hours, 8 hours, 12 hours, and 24 hours. The inverted and non-inverted outputs of flip-flop 328 are used to drive an output display 334, such as a target display or an RF probe. Alternatively, a relay (not shown) could be activated to provide contact closure.

A power supply 331 provides power for the system. Power could be provided by a battery, preferably of the type sized to provide power for 10-20 years of use given normal conditions. The battery is preferably disposed in the logic compartment, and bussed to the sensor compartments. Alternatively, each compartment could house a separate battery, and power only the components disposed in that compartment.

Persons of skill in the art will understand that the particular circuitry configuration depicted herein is not required to enjoy the advantages of the disclosed invention. Furthermore, it should be understood that numerous different configurations of logic and/or sensors could be used to practice the disclosed invention. For example, while an entirely analog sensor and logic implementation is discussed herein, a digital implementation using an analog-to-digital converter to acquire a signal and a microprocessor to make logic decisions could be used to practice the disclosed invention.

Figure 10:
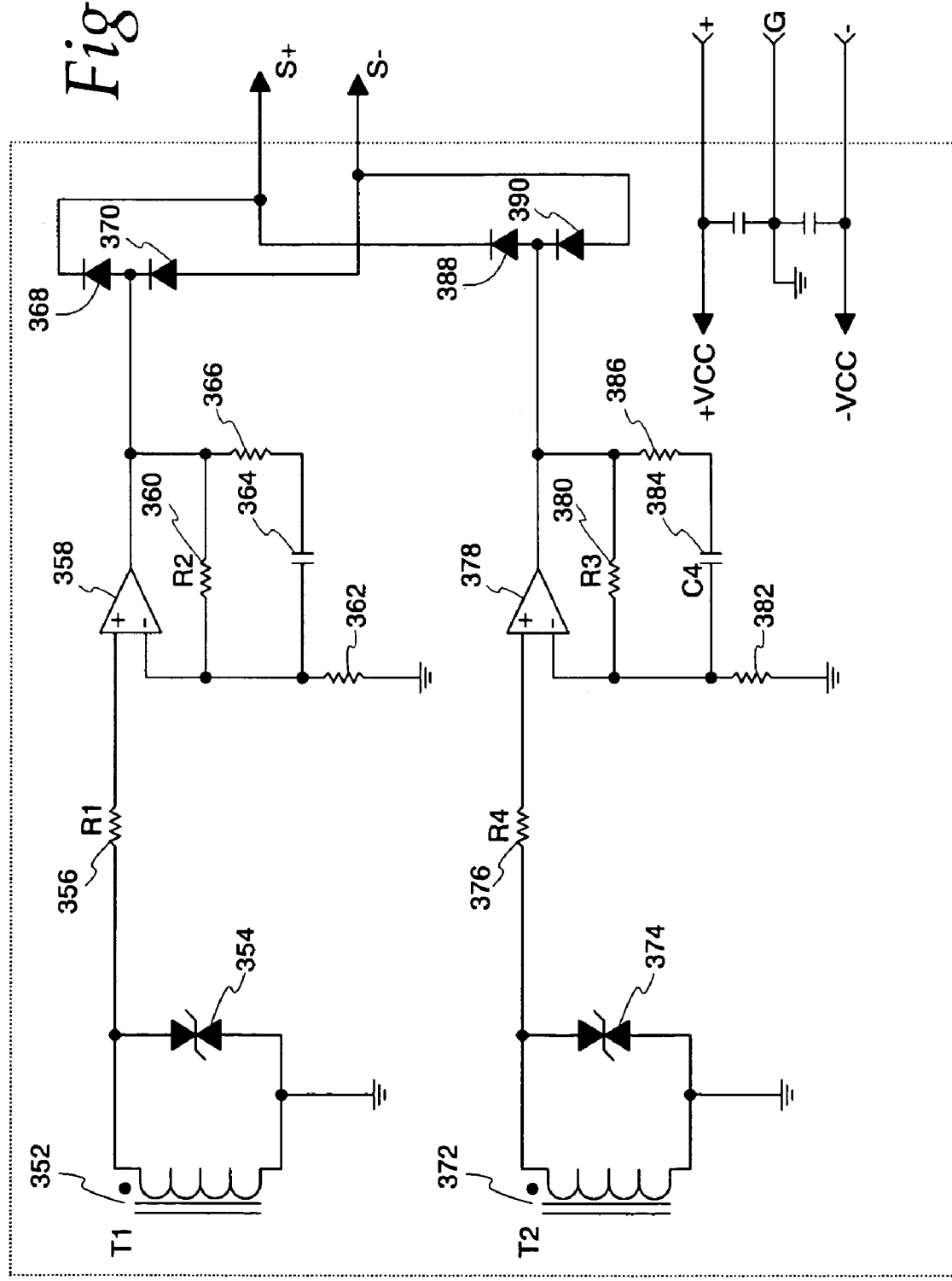
FIG. 10 is a simplified schematic diagram of one possible implementation of a sensor and amplifier board for use with the three-phase faulted circuit indicator of FIG. 4.

FIG. 10 is a more detailed schematic diagram of one possible electronic implementation of a single sensor board. A pair of sense coils 352, 372 magnetically acquire a current signal representative of the current flowing through a physically near internal conductor of a monitored three-phase power cable. Transient voltage suppressors 354, 374 limit any voltage spikes across the sense coil to prevent damage to the coil. Resistors 356, 376, which could, for example, be set to 1 megaohm, limit current into the positive inputs of amplifiers 358, 378, which are configured as non-inverting amplifiers. Resistors 360, 366, and 362, which could be set to 3.01 megaohm, 1.0 megaohm, and 100 kiloohm respectively, operate to set the gain of amplifier 358, and, when combined with capacitor 364, which could, for example, be set to 1000 picofarad, also operate as a filter on the output of amplifier 358. Resistors 380, 382, and 386, as well as capacitor 384, perform identical functions in regards to amplifier 378. Diodes 368, 370, 388, and 390 are provided to ensure that current does not flow into the sensor board from another board, as the outputs of the sensor boards are wire-orred together. Power operating the circuitry of the sensor compartments is preferably provided by means of a battery disposed in the logic module.

Figure 11:
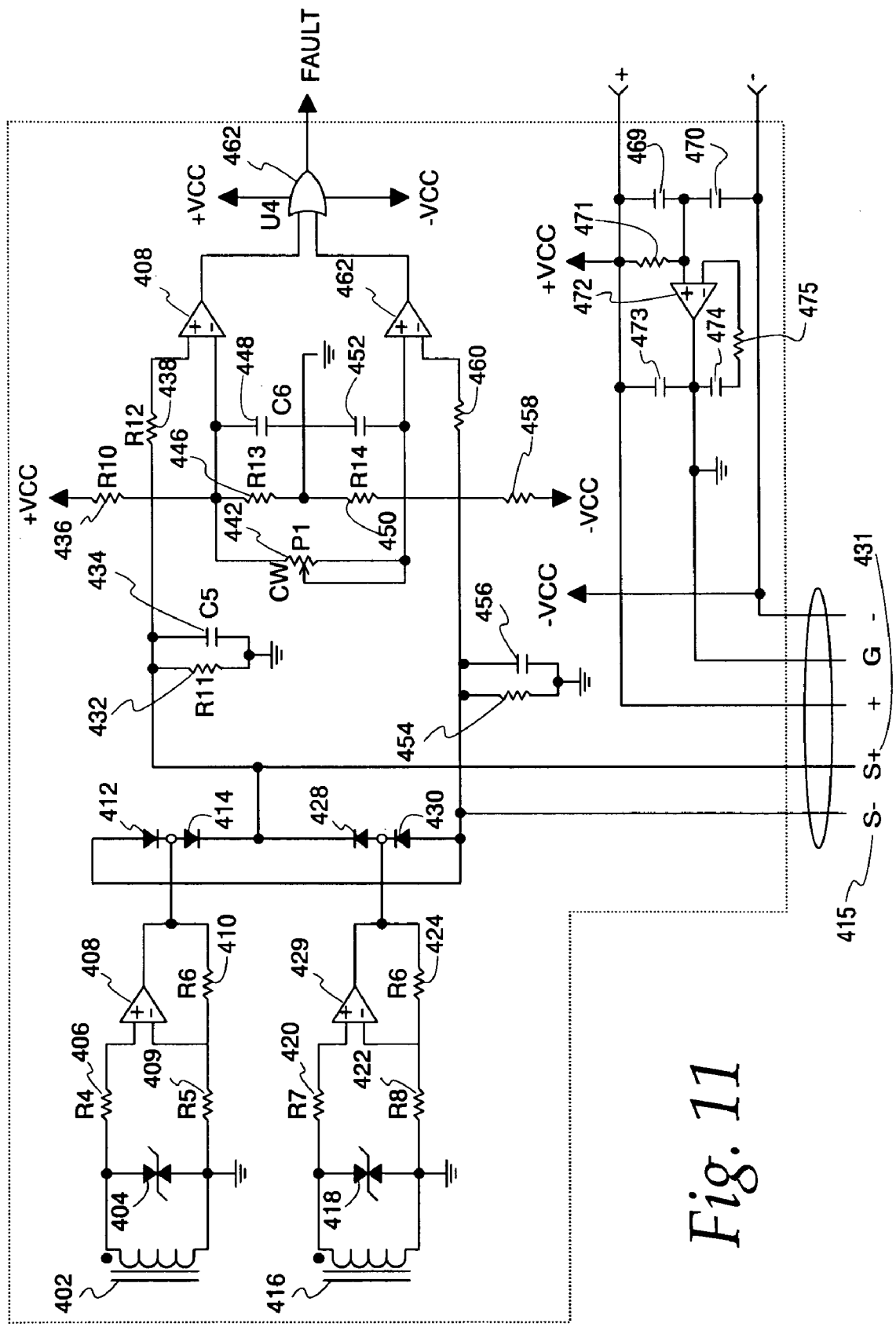
FIG. 11 is a simplified schematic diagram of one possible implementation of a logic board for use with the three-phase faulted circuit indicator of FIG. 4.

FIG. 11 depicts one possible electronic implementation of a logic board that could be used with the disclosed embodiments. A pair of sense coils 402, 416 magnetically acquire a current signal representative of the current flowing through a physically near internal conductor of a monitored three-phase power cable. Transient voltage suppressors 404, 418 limit any voltage spikes across the sense coil to prevent damage to it. Resistors 406, 420 which could be set to 1 megaohm, limit current into the positive inputs of amplifiers 408, 429, which are configured as non-inverting amplifiers. Resistors 410 and 409, which could be set to 3.01 megaohm and 1.0 megaohm respectively, operate to set the gain of amplifier 408. Resistors 424 and 422 perform the identical function in regards to amplifier 429. Diodes 412, 414, 428, and 430 are provided to ensure that current does not flow into the logic from another board, as the outputs of the sensor boards are wire-orred together with the sense circuits present on the logic board at connectors 415 and 431.

The orred values of all sensor boards and the sense circuits present on the logic board are passed through filters created by resistors 432,454, both of which could be set to 1.0 megaohm, and capacitors 434 and 456, which could be set to 0.047 microfarads. Resistors 436, 438 and 446, which could be set to 4.7 megaohm, 1.0 megaohm, and 10 megaohm, act to bias the positive input of comparator 449, while resistors 458, 460, and 450 act to bias the negative input of comparator 462. Capacitors 448 and 452, both of which could be set to 0.1 microfarad, act to smooth the negative input to comparator 449 and the positive input of comparator 462. Finally, adjustable resistor 442 acts to set a reference level for the negative input of comparator 449 and the positive input of comparator 462. The outputs of both comparators are input into OR gate 464. The output of OR gate 464 is effectively the trip output of the faulted circuit indicator, and as such it is routed to an output device, such as a display or wireless probe. The output of OR gate 464 will be activated when either the output of comparator 449 or 462 goes high, which is triggered when the positive input of comparator 449 exceeds the predetermined reference level input to the negative input of comparator 449, and when the negative input of comparator 462 falls below the predetermined reference level established by the positive input of comparator 462. The active inputs of comparators 449 and 462 are proportional to the currents sensed by the magnetic sensors.

Power is generated by a simple power supply circuit. A pair of capacitors 469 and 470 provides filtering of the battery voltage, while resistor 471 biases the positive input of amplifier 472 to battery positive. A local ground designed to be set at one-half the battery voltage is generated using an amplifier 472 configured as a voltage follower. Resistor 475 current limits the follower input to amplifier 472, and capacitors 473 and 474 provide filtering of the output voltage.

Figure 12:
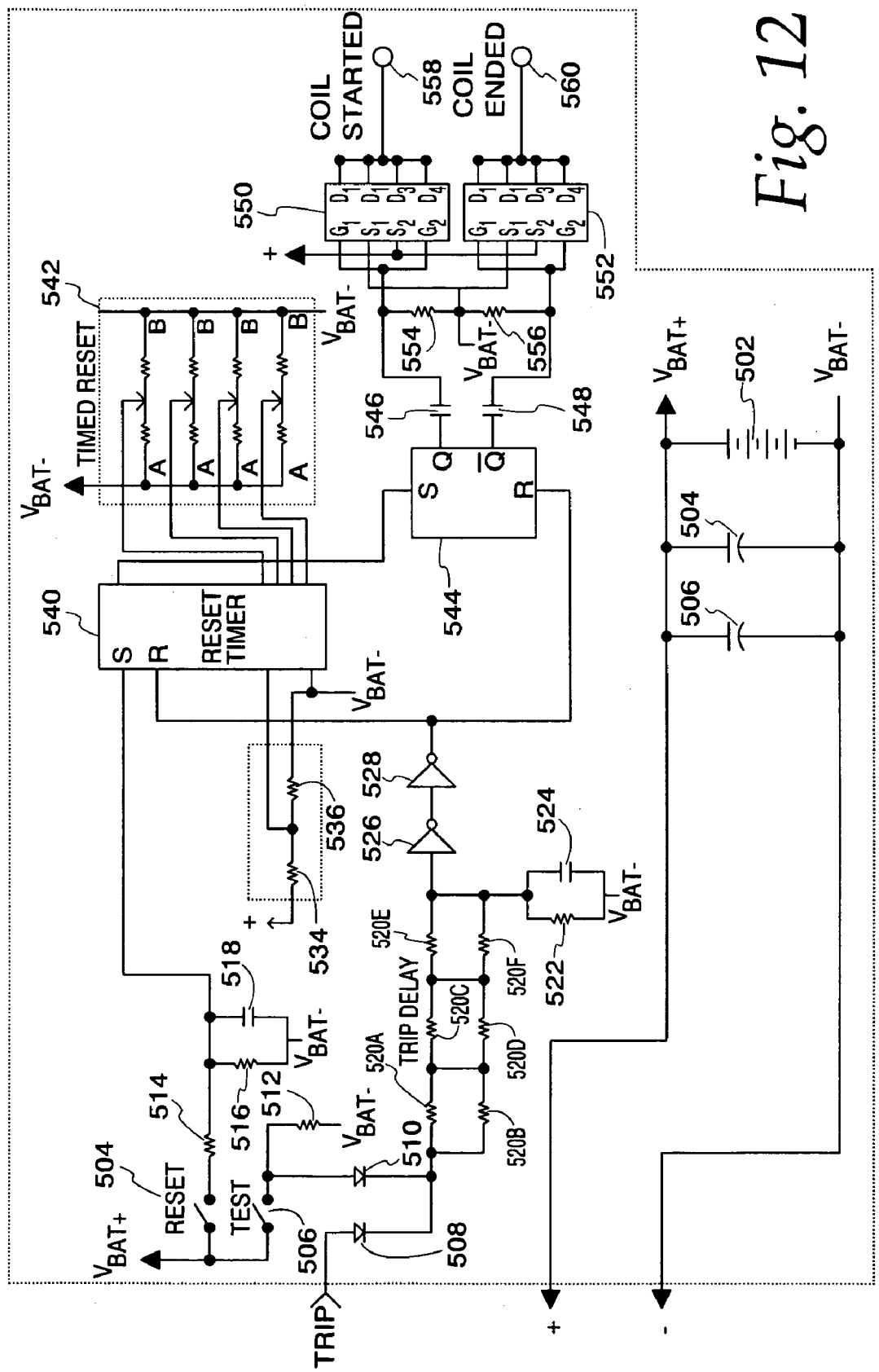
FIG. 12 is a schematic view of one possible implementation of a trip/reset board for use with the three-phase faulted circuit indicator of FIG. 4.

FIG. 12 depicts one possible circuit implementation of a trip/reset board that could be used with the disclosed embodiments. A trip signal from the logic board is accepted, and passed through a diode 508 to protect circuitry on the trip/reset board. Resister 522, which may be set to 2.2 megaohm, and capacitor 524, which may be set to 0.1 microfarad, provide a simple filter for the trip signal, and, along with resistors 520A-f provide a means for programming a variable minimum trip time. For example, resistors 520B, 520D, and 520F may be set to 118K, 49.9K, and 169K respectively. By selectively populating resistors 520A, 520C and 520E the required trip time can be adjusted. When resistors 520A, 520C, and 520E, which may be set to 68.1K, 0.0, and 0.0 ohms respectively, are populated, the trip signal must persist for at least 8 milliseconds before the trip circuit is activated. However, if only resistors 520C and 520E are populated, a 16 millisecond trip signal is required. Further, if only resistor 520E is populated, a 24 millisecond trip signal will be required. Finally, if none of resistors 520A, 520C, and 520E are populated, the trip signal must persist for 50 milliseconds.

The delayed trip signal is passed through a pair of inverters 526 and 528 and from there into the reset input of reset timer 540 and the reset input of SR Flip Flop 544. The Q and /Q outputs of flip flop 544 are used to drive the coil start 558 and coil end 560 outputs through drivers 550 and 552, which may be power field effect transistors. Capacitors 546 and 548, along with resistors 554 and 556, complete the gate drive circuits for drivers 550 and 552.

Reset timer 540 provides a selectable reset time period. This allows for automatic clearing of faulted conditions corresponding to temporary faults, without the power company having to dispatch personnel to manually clear the faulted indication. By selectively populating the resistors in timed reset block 542, a reset period of up to 16 hours can be selected.

Reset switch 504 is coupled to the set input of reset timer 540 through resistor 514, and when activated will immediately activate the reset output of the timer 540, thereby triggering the set input of SR flip flop 544, thereby resetting drivers 550 and 552, and resetting a trip condition. Resistor 516 and capacitor 518 couple the set input of reset timer 540 to negative battery voltage. Test switch 506 will activate the trip circuitry in the same way that a trip signal from the logic board. One contact of test switch 506 is coupled to negative battery voltage through resistor 512; the same contact is coupled to the trip delay circuit described above through diode 510. The other contact of the test switch is coupled directly to positive battery voltage. Reset timer 540 receives power through a divider circuit implemented by resistors 534 and 536.

A battery 502 resides on the trip/reset board and provides power for the system. A pair of capacitors 572 and 574, which may be electrolytic capacitors each with a value of 470 microfarads, provide a low impedance output for the power circuit.

Figure 13B:
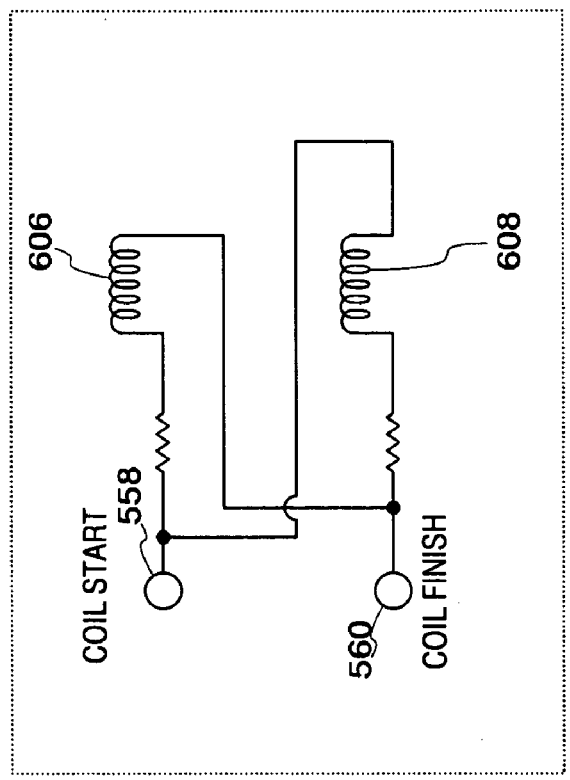
FIG. 13b is a block diagram depicting the coupling of a wireless fault indication system to the three-phase faulted circuit indicator of FIG. 4.
Figure 13A:
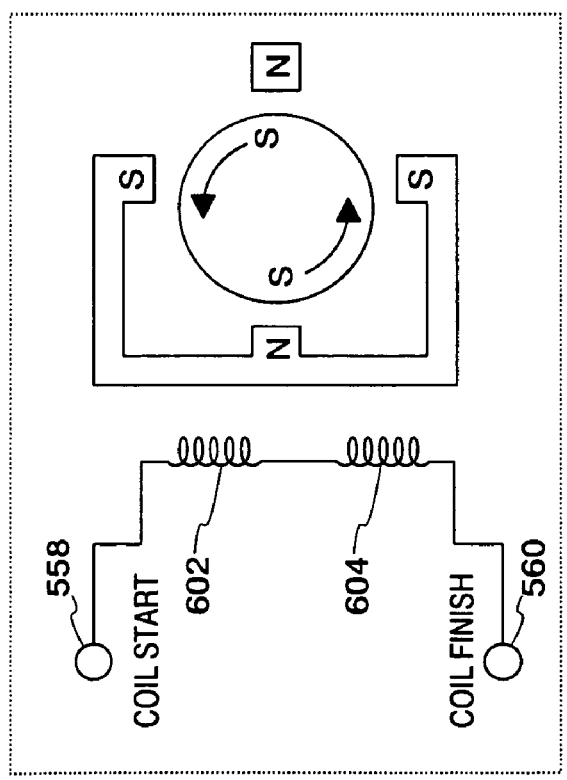
FIG. 13a is a block diagram depicting the coupling of a target display to the three-phase faulted circuit indicator of FIG. 4.

FIGS. 13a and 13b provide alternative output circuits for the trip/reset board. FIG. 13a depicts a conventional flag output, and is thoroughly described in U.S. Pat. No. 4,794,329, which is assigned to Schweitzer Engineering Laboratories, Inc. of Pullman, Wash. In brief, energizing magnetic coils 602 and 604 will cause the magnetically coupled indicator to turn to the left or right. FIG. 13b depicts a magnetic probe output corresponding to a wireless RADIORANGER® probe, as described in United States Publication Number 2008/0012702, which is also assigned to Schweitzer Engineering Laboratories, Inc. of Pullman, Wash. Briefly, magnetic coils 606 and 608 may be energized to cause or clear the indication of a fault on a wirelessly coupled display.

The process by which the faulted circuit indicator of FIG. 4 can be installed on a power cable is shown in FIGS. 14a-f. The disclosed faulted circuit indicator 200 will mount directly over the three-phase power cable 200, and no individual conductors will need to be broken out. Further, given the number and placement of the magnetic sensors in the disclosed faulted circuit indicator, no additional procedure is required by maintenance personnel to precisely place a sensor in a rotational relationship with the individual conductors contained within the three-phase power cable. In addition, there is no requirement that the individual conductors are round or any other shape. Essentially, the installer will open the faulted circuit indicator 200 as depicted in FIG. 14a, and mount the faulted circuit indicator 200 over the power cable 100 as depicted in FIGS. 14b and 14c. The installer will then pull the strap 211 through a strap guide 293, as shown in FIG. 14d, and pull the strap 211 tight using pliers in FIG. 14e. The installed faulted circuit indicator 200 is shown in FIG. 14f.

The foregoing description of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and various modifications as are suited to the particular use contemplated. It is intended that the scope of the invention not be limited by the specification, but be defined by the claims set forth below.

What is claimed is:

1. A faulted circuit indicator for sensing a fault current within a three-phase power cable having a plurality of conductors and an exterior conductive layer, the faulted circuit indicator comprising:
   i) a flexible holder adapted to mount on the exterior conductive layer;
   ii) four or more magnetic sensors disposed periodically along the length of the flexible holder, the magnetic sensors adapted to monitor current flow within an internal conductor of the three-phase power cable and to generate a voltage indicative of the monitored current; and
   iii) a logic circuit coupled to the magnetic sensors, the logic circuit generating a fault signal when the voltage generated by one or more of the magnetic sensors exceeds a predetermined level.

2. The faulted circuit indicator of claim 1 wherein the four or more magnetic sensors each comprise a magnetic coil.

3. The faulted circuit indicator of claim 1 further comprising an output device coupled to the logic circuit and responsive to the fault signal, the output device further indicating the presence of a fault on the monitored three-power cable.

4. The faulted circuit indicator of claim 3 wherein the output device comprises a target display.

5. The faulted circuit indicator of claim 3 wherein the output device comprises a wireless fault indication system.

6. A faulted circuit indicator for sensing a fault current within a three-phase power cable having first, second, and third separate internal conductors, the faulted circuit indicator comprising:
   i) four or more sensor compartments disposed substantially equidistant from a center point so that each sensor compartment is adjacent to two other sensor compartments, each sensor compartment having a conductor surface with interior and exterior sides, the exterior side of the conductor surface being adapted to at least partially contact the three-phase power cable, each sensor compartment also including one or more magnetic sensors disposed within the sensor compartment near the interior side of the conductor surface, the magnetic sensors adapted to monitor current flow within an internal conductor of the three-phase power cable and to generate a voltage indicative of the monitored current; and ii) a logic circuit electrically coupled to the one or more magnetic sensors disposed within each of the sensor compartments, the logic circuit generating a fault signal when the voltage generated by one or more of the magnetic sensors exceeds a predetermined level.

7. The faulted circuit indicator of claim 6 further comprising an output device electrically coupled to the logic circuit and responsive to the fault signal, the output device further indicating whether a fault has occurred on the monitored three-phase power cable.

8. The faulted circuit indicator of claim 7 wherein the output device comprises a target display.

9. The faulted circuit indicator of claim 7 wherein the output device comprises a wireless fault indication system.

10. The faulted circuit indicator of claim 6 wherein each of the sensor compartments is rotatingly coupled to each adjacent sensor compartment.

11. The faulted circuit indicator of claim 6 wherein each of the sensor compartments includes two posts, and wherein each of the sensor compartments is coupled to each adjacent sensor compartment by a sliding member disposed on the posts.

12. The faulted circuit indicator of claim 6 wherein the logic circuit is disposed within one of the sensor compartments.

13. The faulted circuit indicator of claim 6 wherein each of the sensor compartments includes two magnetic sensors, and wherein each of the magnetic sensors is circumferentially offset from one another.

14. The faulted circuit indicator of claim 13 wherein the two magnetic sensors contained within each of the sensor compartments are axially offset from one another relative to a longitudinal axis of the power cable.

15. The faulted circuit indicator of claim 6 wherein the power cable is substantially round and wherein the four or more sensor compartments are adapted to substantially surround a segment of the power cable.

16. The faulted circuit indicator of claim 15 wherein the four or more sensor compartments are adapted to surround the segment of the power cable so that at least one of the conductor surfaces overlaps another of the conductor surfaces.

17. The faulted circuit indicator of claim 6 further comprising a logic compartment, and wherein the logic circuit is disposed within the logic compartment.

18. The faulted circuit indicator of claim 13 wherein the logic compartment is directly connected to at least one of the sensor compartments.

19. A method of installing a three-phase faulted circuit indicator on a three-phase power cable, the method comprising the steps of:
   i) providing a three-phase faulted circuit indicator adapted to be installed on a three-phase power cable, the three-phase faulted circuit indicator comprising a plurality of sensors;
   ii) the three-phase power cable having a plurality of conductors, each of the conductors having a position measured with respect to a vertical axis passing through a center point of the three-phase power cable; and
   iii) mounting the three-phase faulted circuit indicator on the power cable, wherein the plurality of sensors may be disposed irrespective of the position of the three conductors.

20. The method of claim 19 wherein no alignment relative to the three-phase power cable is required when mounting the three-phase faulted circuit indicator.

21. A system for sensing a fault current within a power cable having multiple conductors, the system comprising:
   i) four or more magnetic sensors disposed about the periphery of the power cable, the magnetic sensors adapted to monitor magnetic flux emissions from the power cable and produce a voltage indicative of current flow within one of the multiple conductors within the power cable;
   ii) the magnetic sensors disposed so that the placement of any particular magnetic sensor will not substantially interfere with the magnetic flux emissions monitored by an adjacent magnetic sensor; and a logic circuit coupled to the magnetic sensors, the logic circuit generating a fault signal when the voltage generated by at least one of the magnetic sensors exceeds a predetermined level.

22. The system of claim 21 wherein each of the four or more magnetic sensors is a magnetic coil.

23. The system of claim 21 further comprising an output device coupled to the logic circuit and responsive to the fault signal, the output device indicating whether a fault has occurred on the power cable.

24. The system of claim 23 wherein the output device comprises a local target display.

25. The system of claim 24 wherein the output device comprises a wireless fault indication system.

26. The system of claim 23 further comprising a test switch coupled to the logic circuit, the test switch triggering the generation of the fault signal.

27. The system of claim 23 further comprising a reset switch coupled to the logic circuit, the reset switch resetting said fault signal.

* * * * *